(12) United States Patent
Noble et al.

(10) Patent No.: US 6,486,027 B1
(45) Date of Patent: *Nov. 26, 2002

(54) FIELD PROGRAMMABLE LOGIC ARRAYS WITH VERTICAL TRANSISTORS

(75) Inventors: Wendell P. Noble, Milton, VT (US); Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/520,494

(22) Filed: Mar. 8, 2000

Related U.S. Application Data

(62) Division of application No. 09/032,617, filed on Feb. 27, 1998, now Pat. No. 6,124,729.

(51) Int. Cl.[7] .......................................... H01L 21/8247
(52) U.S. Cl. ...................................... 438/259; 438/257
(58) Field of Search .................................. 438/257–267

(56) References Cited

U.S. PATENT DOCUMENTS

| 3,657,575 A | 4/1972 | Taniguchi et al. ........... 307/304 |
| 3,806,741 A | 4/1974 | Smith ........................ 307/304 |
| 3,931,617 A | 1/1976 | Russell ..................... 340/173 R |
| 4,020,364 A | 4/1977 | Kuijk ........................ 307/242 |
| 4,051,354 A | 9/1977 | Choate ....................... 235/312 |

(List continued on next page.)

FOREIGN PATENT DOCUMENTS

| JP | 61-140170 | 6/1986 | ........... H01L/27/10 |
| JP | 363066963 A | 3/1988 | ................. 257/305 |
| JP | 5226661 | 9/1993 | ......... H01L/29/784 |
| JP | 11-135757 | 5/1999 | |
| JP | 2000-164883 | 6/2000 | |

OTHER PUBLICATIONS

Adler, E., et al., "The Evolution of IBM CMOS DRAM Technology", *IBM J. Res. Develop.*, 39(1/2), 167–188, (1995).

Asai, S., et al., "Technology Challenges for Integration Near and Below 0.1 micrometer", *Proceedings of the IEEE*, 85(4), Special Issue on Nanometer–Scale Science & Technology, 505–520, (Apr. 1997).

Askin, H.O., et al., "Fet Device Parameters Compensation Circuit", *IBM Technical Disclosure Bulletin*, 14, 2088–2089, (Dec. 1971).

(List continued on next page.)

Primary Examiner—Richard Booth
(74) Attorney, Agent, or Firm—Schwegman, Lundberg, Woessner & Kluth, P.A.

(57) ABSTRACT

A field programmable logic array with vertical transistors having single or split control lines is used to provide logical combinations responsive to an input signal. The transistor is a field-effect transistor (FET) having an electrically isolated (floating) gate that controls electrical conduction between source regions and drain regions. If a particular floating gate is charged with stored electrons, then the transistor will not turn on and will act as the absence of a transistor at this location in a logic array within the field programmable logic array. The field programmable logic array is programmed in the field to select a particular logic combination responsive to a received input signal. A logic array includes densely packed logic cells, each logic cell having a semiconductor pillar providing shared source and drain regions for two vertical floating gate transistors that have individual floating gates and control lines distributed on opposing sides of the pillar. Both bulk semiconductor and silicon-on-insulator embodiments are provided. If a floating gate transistor is used to represent a logic function, an area of only $2F^2$ is needed per bit of logic, where F is the minimum lithographic feature size.

27 Claims, 16 Drawing Sheets

U.S. PATENT DOCUMENTS

| | | | |
|---|---|---|---|
| 4,252,579 A | 2/1981 | Ho et al. .................... 148/174 |
| 4,313,106 A | 1/1982 | Hsu ...................... 340/825.91 |
| 4,604,162 A | 8/1986 | Sobczak ..................... 156/657 |
| 4,617,649 A | 10/1986 | Kyomasu et al. ............ 365/189 |
| 4,630,088 A | 12/1986 | Ogura et al. ................ 357/23.6 |
| 4,663,831 A | 5/1987 | Birrittella et al. ......... 29/576 E |
| 4,673,962 A | 6/1987 | Chatterjee et al. .......... 357/23.6 |
| 4,677,589 A | 6/1987 | Haskell et al. ............... 365/149 |
| 4,716,314 A | 12/1987 | Mulder et al. ............... 307/477 |
| 4,740,826 A | 4/1988 | Chatterjee .................... 357/42 |
| 4,761,768 A | 8/1988 | Turner et al. ................ 365/201 |
| 4,766,569 A | 8/1988 | Turner et al. ................ 365/185 |
| 4,845,537 A | 7/1989 | Nishimura et al. ......... 357/23.4 |
| 4,888,735 A | 12/1989 | Lee et al. .................... 365/185 |
| 4,906,590 A | 3/1990 | Kanetaki et al. .............. 437/52 |
| 4,920,065 A | 4/1990 | Chin et al. .................... 437/52 |
| 4,920,515 A | 4/1990 | Obata .................... 365/189.08 |
| 4,929,988 A | 5/1990 | Yoshikawa ................ 357/23.5 |
| 4,949,138 A | 8/1990 | Nishimura ................. 357/23.6 |
| 4,958,318 A | 9/1990 | Harari ........................ 365/149 |
| 4,965,651 A | 10/1990 | Wagner ........................ 357/42 |
| 4,987,089 A | 1/1991 | Roberts ........................ 437/34 |
| 5,001,526 A | 3/1991 | Gotou ....................... 357/23.6 |
| 5,006,909 A | 4/1991 | Kosa ......................... 357/23.6 |
| 5,010,386 A | 4/1991 | Groover, III ................. 357/42 |
| 5,017,504 A | 5/1991 | Nishimura et al. ........... 437/40 |
| 5,021,355 A | 6/1991 | Dhong et al. ................. 437/35 |
| 5,028,977 A | 7/1991 | Kenneth et al. .............. 357/43 |
| 5,057,896 A | 10/1991 | Gotou .......................... 357/49 |
| 5,072,269 A | 12/1991 | Hieda ........................ 357/23.6 |
| 5,083,047 A | 1/1992 | Horie et al. ................. 307/465 |
| 5,087,581 A | 2/1992 | Rodder ........................ 437/41 |
| 5,102,817 A | 4/1992 | Chatterjee et al. ............ 437/47 |
| 5,107,459 A | 4/1992 | Chu et al. ..................... 365/63 |
| 5,110,752 A | 5/1992 | Lu ............................... 437/47 |
| 5,128,831 A | 7/1992 | Fox, III et al. |
| 5,140,388 A | 8/1992 | Bartelink .................... 357/23.4 |
| 5,156,987 A | 10/1992 | Sandhu et al. ................ 437/40 |
| 5,177,028 A | 1/1993 | Manning ...................... 437/41 |
| 5,177,576 A | 1/1993 | Kimura et al. ................ 257/71 |
| 5,191,509 A | 3/1993 | Wen ........................... 361/311 |
| 5,202,278 A | 4/1993 | Mathews et al. .............. 437/47 |
| 5,208,657 A | 5/1993 | Chatterjee et al. .......... 257/302 |
| 5,216,266 A | 6/1993 | Ozaki ......................... 257/302 |
| 5,221,867 A | 6/1993 | Mitra et al. ................. 307/465 |
| 5,223,081 A | 6/1993 | Doan .......................... 156/628 |
| 5,266,514 A | 11/1993 | Tuan et al. .................... 437/52 |
| 5,276,343 A | 1/1994 | Kumagai et al. ........... 257/306 |
| 5,292,676 A | 3/1994 | Manning ...................... 437/46 |
| 5,316,962 A | 5/1994 | Matsuo et al. ................ 437/52 |
| 5,320,880 A | 6/1994 | Sandhu et al. ............... 427/578 |
| 5,327,380 A | 7/1994 | Kersh, III et al. .......... 365/195 |
| 5,329,481 A | 7/1994 | Seevinck et al. ............ 365/177 |
| 5,341,331 A | 8/1994 | Jeon ...................... 365/189.01 |
| 5,376,575 A | 12/1994 | Kim et al. .................... 437/52 |
| 5,378,914 A | 1/1995 | Ohzu et al. .................. 257/369 |
| 5,379,255 A * | 1/1995 | Shah .......................... 365/185 |
| 5,382,540 A * | 1/1995 | Sharma et al. |
| 5,385,853 A | 1/1995 | Mohammad ................ 437/41 |
| 5,385,854 A | 1/1995 | Batra et al. ................... 437/41 |
| 5,391,911 A | 2/1995 | Beyer et al. ................. 257/522 |
| 5,392,245 A | 2/1995 | Manning .................... 365/200 |
| 5,393,704 A | 2/1995 | Huang et al. ................ 437/203 |
| 5,396,093 A | 3/1995 | Lu .............................. 257/306 |
| 5,409,563 A | 4/1995 | Cathey ........................ 156/643 |
| 5,410,169 A | 4/1995 | Yamamoto et al. ......... 257/301 |
| 5,414,287 A | 5/1995 | Hong .......................... 257/316 |
| 5,414,288 A | 5/1995 | Fitch et al. .................. 257/328 |
| 5,416,350 A | 5/1995 | Watanabe .................... 257/330 |
| 5,422,499 A | 6/1995 | Manning ...................... 257/67 |
| 5,427,972 A | 6/1995 | Shimizu et al. ................ 437/52 |
| 5,432,739 A | 7/1995 | Pein ........................... 365/185 |
| 5,438,009 A | 8/1995 | Yang et al. .................... 437/52 |
| 5,440,158 A | 8/1995 | Sung-Mu ..................... 257/314 |
| 5,443,992 A | 8/1995 | Risch et al. ................... 437/29 |
| 5,445,986 A | 8/1995 | Hirota .......................... 437/60 |
| 5,451,538 A | 9/1995 | Fitch et al. .................... 487/60 |
| 5,451,889 A | 9/1995 | Heim et al. ................... 326/81 |
| 5,460,316 A | 10/1995 | Hefele .......................... 228/39 |
| 5,460,988 A | 10/1995 | Hong ............................ 437/43 |
| 5,466,625 A | 11/1995 | Hsieh et al. ................... 437/52 |
| 5,483,094 A | 1/1996 | Sharma et al. .............. 257/316 |
| 5,483,487 A | 1/1996 | Sung-Mu ................ 365/185.33 |
| 5,492,853 A | 2/1996 | Jeng et al. ..................... 437/60 |
| 5,495,441 A | 2/1996 | Hong .................... 365/185.01 |
| 5,497,017 A | 3/1996 | Gonzales .................... 257/306 |
| 5,502,629 A | 3/1996 | Ito et al. ....................... 363/60 |
| 5,504,357 A | 4/1996 | Kim et al. ................... 257/306 |
| 5,508,219 A | 4/1996 | Bronner et al. ............... 437/52 |
| 5,508,542 A | 4/1996 | Geis et al. ................... 257/301 |
| 5,519,236 A | 5/1996 | Ozaki ......................... 257/302 |
| 5,528,062 A | 6/1996 | Hsieh et al. ................. 257/298 |
| 5,563,083 A * | 10/1996 | Pein |
| 5,574,299 A | 11/1996 | Kim ........................... 257/296 |
| 5,593,912 A | 1/1997 | Rajeevakumar .............. 437/52 |
| 5,612,559 A | 3/1997 | Park et al. ................... 257/302 |
| 5,616,934 A | 4/1997 | Dennison et al. .............. 257/67 |
| 5,627,390 A | 5/1997 | Maeda et al. ................ 257/302 |
| 5,637,898 A | 6/1997 | Baliga ........................ 257/330 |
| 5,640,642 A | 6/1997 | Gonzalez .................... 365/156 |
| 5,641,545 A | 6/1997 | Sanhu ......................... 427/573 |
| 5,644,540 A | 7/1997 | Manning .................... 365/200 |
| 5,646,900 A | 7/1997 | Tsukude et al. ............. 365/205 |
| 5,674,769 A | 10/1997 | Alsmeier et al. .............. 437/52 |
| 5,691,230 A | 11/1997 | Forbes ......................... 437/62 |
| 5,705,415 A | 1/1998 | Orlowski et al. ............. 437/43 |
| 5,707,885 A | 1/1998 | Lim ............................. 437/52 |
| 5,719,409 A | 2/1998 | Singh et al. ................... 257/77 |
| 5,753,947 A | 5/1998 | Gonzalez .................... 257/296 |
| 5,760,434 A | 6/1998 | Zahurak et al. ............. 257/309 |
| 5,780,888 A | 7/1998 | Maeda et al. ................ 257/302 |
| 5,789,967 A | 8/1998 | Katoh ......................... 327/408 |
| 5,801,413 A | 9/1998 | Pan ............................ 257/301 |
| 5,818,084 A | 10/1998 | Williams et al. ............ 257/329 |
| 5,821,578 A | 10/1998 | Shimoji ...................... 257/295 |
| 5,821,796 A | 10/1998 | Yaklin et al. ................ 327/313 |
| 5,827,765 A | 10/1998 | Stengl et al. ................ 438/243 |
| 5,834,814 A | 11/1998 | Ito ............................... 257/378 |
| 5,852,375 A | 12/1998 | Byrne et al. ................ 327/108 |
| 5,874,760 A | 2/1999 | Burns et al. ................. 257/315 |
| 5,877,061 A | 3/1999 | Halle et al. ................. 438/386 |
| 5,879,971 A | 3/1999 | Witek ......................... 438/238 |
| 5,907,170 A | 5/1999 | Forbes et al. ............... 257/296 |
| 5,909,618 A | 6/1999 | Forbes et al. ............... 438/242 |
| 5,914,511 A | 6/1999 | Noble et al. ................ 257/302 |
| 5,920,088 A | 7/1999 | Augusto ...................... 257/192 |
| 5,936,274 A | 8/1999 | Forbes et al. ............... 257/315 |
| 5,943,267 A | 8/1999 | Sekariapuram et al. 365/185.28 |
| 5,973,352 A | 10/1999 | Noble ......................... 257/315 |
| 5,973,356 A | 10/1999 | Noble et al. ................ 257/319 |
| 5,981,995 A | 11/1999 | Selcuk ........................ 257/330 |
| 5,991,225 A | 11/1999 | Forbes et al. ........... 365/230.06 |
| 6,025,225 A | 2/2000 | Forbes et al. ............... 438/243 |
| 6,040,210 A | 3/2000 | Burns et al. ................. 438/238 |
| 6,040,218 A * | 3/2000 | Lam ........................... 438/259 |
| 6,043,527 A | 3/2000 | Forbes ........................ 257/296 |
| 6,066,869 A | 5/2000 | Noble et al. ................ 257/296 |
| 6,072,209 A | 6/2000 | Noble et al. ................ 257/296 |
| 6,143,636 A * | 11/2000 | Forbes et al. ............... 438/587 |
| 6,150,687 A | 11/2000 | Noble et al. ................ 257/302 |
| 6,153,468 A * | 11/2000 | Forbes et al. ............... 438/257 |

| | | |
|---|---|---|
| 6,172,391 B1 | 1/2001 | Goebel ........................ 257/305 |
| 6,208,164 B1 | 3/2001 | Noble et al. ................... 326/41 |
| 6,221,788 B1 | 4/2001 | Kobayashi et al. ......... 438/762 |
| 6,255,708 B1 | 7/2001 | Sudharsanan et al. ...... 257/428 |

OTHER PUBLICATIONS

Banerjee, S.K., et al., "Characterization of Trench Transistors for 3–D Memories", *1986 Symposium on VLSI Technology, Digest of Technical Papers*, San Diego, CA, 79–80, (May 1986).

Blalock, T.N., et al., "A High–Speed Sensing Scheme for 1T Dynamic RAM's Utilizing the Clamped Bit–Line Sense Amplifier", *IEEE Journal of Solid–State Circuits*, 27(4), pp. 618–624, (Apr. 1992).

Bomchil, G., et al., "Porous Silicon: The Material and its Applications in Silicon–On–Insulator Technologies", *Applied Surface Science*, 41/42, 604–613, (1989).

Burnett, D., et al., "Implications of Fundamental Threshold Voltage Variations for High–Density SRAM and Logic Circuits", *1994 Symposium on VLSI Technology, Digest of Technical Papers*, Honolulu, HI, 15–16, (Jun. 1994).

Burnett, D., et al., "Statistical Threshold–Voltage Variation and its Impact on Supply–Voltage Scaling", *Proceedings SPIE: Microelectronic Device and Multilevel Interconnection Technology*, 2636, 83–90, (1995).

Chen, M., et al., "Back–Gate Forward Bias Method for Low Voltage CMOS Digital Cicuits", *IEEE Transactions on Electron Devices*, 43, 904–909, (1996).

Chen, M.J., et al., "Optimizing the Match in Weakly Inverted MOSFET's by Gated Lateral Bipolar Action", *IEEE Transactions on Electron Devices*, 43, 766–773, (May 1996).

Chung, I.Y., et al., "A New SOI Inverter for Low Power Applications", *Proceedings of the 1996 IEEE International SOI Conference*, Sanibel Island, FL, 20–21, (1996).

Clemen, R., et al., "VT–compensated TTL–Compatible Mos Amplifier", *IBM Technical Disclosure Bulletin*, 21, 2874–2875, (1978).

De, V.K., et al., "Random MOSFET Parameter Fluctuation Limits to Gigascale Integration (GSI)", *1996 Symposium on VLSI Technology, Digest of Technical Papers*, Honolulu, HI, 198–199, (Jun. 11–13, 1996).

DeBar, D.E., "Dynamic Substrate Bias to Achieve Radiation Hardening", *IBM Technical Disclosure Bulletin*, 25, 5829–5830, (1983).

Denton, J.P., et al., "Fully Depleted Dual–Gated Thin–Film SOI P–MOSFET's Fabricated in SOI Islands with an Isolated Buried Polysilicon Backgate", *IEEE Electron Device Letters*, 17(11), 509–511, (Nov. 1996).

Fong, Y., et al., "Oxides Grown on Textured Single–Crystal Silicon—Dependence on Process and Application in EEPROMs", *IEEE Transactions on Electron Devices*, 37(3), pp. 583–590, (Mar. 1990).

Forbes, L., "Automatic On–clip Threshold Voltage Compensation", *IBM Technical Disclosure Bulletin*, 14, 2894–2895, (1972).

Forbes, L., et al., "Resonant Forward–Biased Guard–Ring Diodes for Suppression of Substrate Noise in Mixed–Mode CMOS Circuits", *Electronics Letters*, 31, 720–721, (Apr. 1995).

Foster, R., et al., "High Rate Low–Temperature Selective Tungsten", In: *Tungsten and Other Refractory Metals for VLSI Applications III*, V.A. Wells, ed., Materials Res. Soc., Pittsburgh, PA, 69–72, (1988).

Frantz, H., et al., "Mosfet Substrate Bias–Voltage Generator", *IBM Technical Disclosure Bulletin*, 11, 1219–1220, (Mar. 1969).

Fuse, T., et al., "A 0.5V 200MHz 1–Stage 32b ALU Using a Body Bias Controlled SOI Pass–Gate Logic", *1997 IEEE International Solid–State Circuits Conference, Digest of Technical Papers*, 286–287, (1997).

Gong, S., et al., "Techniques for Reducing Switching Noise in High Speed Digital Systems", *Proceedings of the 8th Annual IEEE International ASIC Conference and Exhibit*, Austin, TX, 21–24, (1995).

Hao, M.Y., et al., "Electrical Characteristics of Oxynitrides Grown on Textured Single–Crystal Silicon", *Appl. Phys. Lett.*, 60, 445–447, (Jan. 1992).

Harada, M., et al., "Suppression on Threshold Voltage Variation in MTCMOS/SIMOX Circuit Operating Below 0.5 V", *1996 Symposium on VLSI Technology, Digest of Technical Papers*, Honolulu, HI, 96–97, (Jun. 11–13, 1996).

Heavens, O., *Optical Properties of Thin Solid Films*, Dover Pubs. Inc., New York, 155–206, (1965).

Hisamoto, D., et al., "A New Stacked Cell Structure for Giga–Bit DRAMs using Vertical Ultra–Thin SOI (DELTA) MOSFETs", *1991 IEEE International Electron Devices Meeting, Technical Digest*, Washington, D.C., 959–961, (Dec. 8–11, 1991).

Hodges, D.A., et al., "MOS Decoders", In: *Analysis and Design of Digital Integrated Circuits*, 2nd Edition, Section: 9.1.3, 354–357, (1988).

Holman, W.T., et al., "A Compact Low Noise Operational Amplifier for a 1.2 Micrometer Digital CMOS Technology", *IEEE Journal of Solid–State Circuits*, 30, 710–714, (Jun. 1995).

Horie, H., et al., "Novel High Aspect Ratio Aluminum Plug for Logic/DRAM LSI's Using Polysilicon–Aluminum Substitute", *Technical Digest: IEEE International Electron Devices Meeting*, San Francisco, CA, 946–948, (1996).

Hu, G., et al., "Will Flash Memory Replace Hard Disk Drive?", *1994 IEEE International Electron Device Meeting*, Panel Discussion, Session 24, Outline, 2 pages, (Dec. 1994).

Huang, W.L., et al., "TFSOI Complementary BiCMOS Technology for Low Power Applications", *IEEE Transactions on Electron Devices*, 42, 506–512, (Mar. 1995).

Jun, Y.K., et al., "The Fabrication and Electrical Properties of Modulated Stacked Capacitor for Advanced DRAM Applications", *IEEE Electron Device Letters*, 13, 430–432, (Aug. 1992).

Jung, T.S., et al., "A 117–mm2 3.3–V Only 128–Mb Multilevel NAND Flash Memory for Mass Storage Applications", *IEEE Journal of Solid–State Circuits*, 31, 1575–1583, (Nov. 1996).

Kang, H.K., et al., "Highly Manufacturable Process Technology for Reliable 256 Mbit and 1Gbit DRAMs", *IEEE International Electron Devices Meeting, Technical Digest*, San Francisco, CA, 635–638, (Dec. 11–14, 1994).

Kim, Y.S., et al., "A Study on Pyrolysis DMEAA for Selective Deposition of Aluminum", In: *Advanced Metallization and Interconnect Systems for ULSI Applications in 1995*, R.C. Ellwanger, et al., (eds.), Materials Research Society, Pittsburgh, PA, 675–680, (1996).

Kishimoto, T., et al., "Well Structure by High–Energy Boron Implantation for Soft–Error Reduction in Dynamic Random Access Memories (DRAMs)", *Japanese Journal of Applied Physics*, 34, 6899–6902, (Dec. 1995).

Klaus, et al., "Atomic Layer Controlled Growth of SiO2 Films Using Binary Reaction Sequence Chemistry", *Applied Physics Lett.* 70(9), 1092–94, (Mar. 3, 1997).

Kohyama, Y., et al., "Buried Bit–Line Cell for 64MB DRAMs", *1990 Symposium on VLSI Technology, Digest of Technical Papers*, Honolulu, HI, 17–18, (Jun. 4–7, 1990).

Koshida, N., et al., "Efficient Visible Photoluminescence from Porous Silicon", *Japanese Journal of Applied Physics*, 30, L1221– L1223, (Jul. 1991).

Kuge, S., et al., "SOI–DRAM Circuit Technologies for Low Power High Speed Multigiga Scale Memories", *IEEE Journal of Solid–State Circuits*, 31(4), pp. 586–591, (Apr. 1996).

Lantz, II, L., "Soft Errors Induced By Alpha Particles", *IEEE Transactions on Reliability*, 45, 174–179, (Jun. 1996).

Lehmann, et al., "A Novel Capacitor Technology Based on Porous Silicon", *Thin Solid Films 276*, Elsevier Science, 138–42, (1996).

Lehmann, V., "The Physics of Macropore Formation in Low Doped n–Type Silicon", *Journal of the Electrochemical Society*, 140(10), 2836–2843, (Oct. 1993).

Lu, N., et al., "The SPT Cell—A New Substrate–Plate Trench Cell for DRAMs", *1985 IEEE International Electrton Devices Meeting, Technical Digest*, Washington, D.C., 771–772, (Dec. 1–4, 1985).

MacSweeney, D., et al., "Modelling of Lateral Bipolar Devices in a CMOS Process", *IEEE Bipolar Circuits and Technology Meeting*, Minneapolis, MN, 27–30, (Sep. 1996).

Maeda, S., et al., "A Vertical Phi–Shape Transistor (VPhiT) Cell for 1 Gbit DRAM and Beyond", *1994 Symposium of VLSI Technology, Digest of Technical Papers*, Honolulu, HI, 133–134, (Jun. 7–9, 1994).

Maeda, S., et al., "Impact of a Vertical Phi–Shape Transistor (VPhiT) Cell for 1 Gbit DRAM and Beyond", *IEEE Transactions on Electron Devices*, 42, 2117–2123, (Dec. 1995).

Malaviya, S., *IBM TBD*, 15, p. 42, (Jul. 1972).

Masu, K., et al., "Multilevel Metallization Based on Al CVD", *1996 IEEE Symposium on VLSI Technology, Digest of Technical Papers*, Honolulu, HI, 44–45, (Jun. 11–13, 1996).

McCredie, B.D., et al., "Modeling, Measurement, and Simulation of Simultaneous Switching Noise", *IEEE Transactions on Components, Packaging, and Manufacturing Technology—Part B*, 19, 461–472, (Aug. 1996).

Muller, K., et al., "Trench Storage Node Technology for Gigabit DRAM Generations", *Digest IEEE International Electron Devices Meeting*, San Francisco, CA, 507–510, (Dec. 1996).

Nitayama, A., et al., "High Speed and Compact CMOS Circuits with Multipillar Surrounding Gate Transistors", *IEEE Transactions on Electron Devices*, 36, 2605–2606, (Nov. 1989).

Ohba, T., et al., "Evaluation on Selective Deposition of CVD W Films by Measurement of Surface Temperature", *In: Tungsten and Other Refractory Metals for VLSI Applications II*, Materials Research Society, Pittsburgh, PA, 59–66, (1987).

Ohba, T., et al., "Selective Chemical Vapor Deposition of Tungsten Using Silane and Polysilane Reductions", *In: Tungsten and Other Refractory Metals for VLSI Applications IV*, Materials Research Society, Pittsburgh, PA, 17–25, (1989).

Ohno, Y., et al., "Estimation of the Charge Collection for the Soft–Error Immunity by the 3D–Device Simulation and the Quantitative Investigation", *Simulation of Semiconductor Devices and Processes*, 6, 302–305, (Sep. 1995).

Oowaki, Y., et al., "New alpha–Particle Induced Soft Error Mechanism in a Three Dimensional Capacitor Cell", *IEICE Transactions on Electronics*, 78–C, 845–851, (Jul. 1995).

Oshida, S., et al., "Minority Carrier Collection in 256 M–bit DRAM Cell on Incidence of Alpha–Particle Analyzed by Three–Dimensional Device Simulation", *IEICE Transactions on Electronics*, 76–C, 1604–1610, (Nov. 1993).

Ott, A.W., et al., "Al303 Thin Film Growth on Si(100) Using Binary Reaction Sequence Chemistry", *Thin Solid Films*, vol. 292, 135–44, (1997).

Ozaki, T., et al., "A Surrounding Isolation–Merged Plate Electrode (SIMPLE) Cell with Checkered Layout for 256Mbit DRAMs and Beyond", *1991 IEEE International Electron Devices Meeting*, Washington, D.C., 469–472, (Dec. 8–11, 1991).

Parke, S.A., et al., "A High–Performance Lateral Bipolar Transistor Fabricated on SIMOX", *IEEE Electron Device Letters*, 14, 33–35, (Jan. 1993).

Pein, H., et al., "A 3–D Sidewall Flash EPROM Cell and Memory Array", *IEEE Transactions on Electron Devices*, 40, 2126–2127, (Nov. 1993).

Pein, H., et al., "Performance of the 3–D PENCIL Flash EPROM Cell and Memory Array", *IEEE Transactions on Electron Devices*, 42, 1982–1991, (Nov., 1995).

Pein, H.B., et al., "Performance of the 3–D Sidewall Flash EPROM Cell", *IEEE International Electron Devices Meeting, Technical Digest*, 11–14, (1993).

Puri, Y., "Substrate Voltage Bounce in NMOS Self–biased Substrates", *IEEE Journal of Solid–State Circuits*, SC–13, 515–519, (Aug. 1978).

Ramo, S., et al., *Fields and Waves in Communication Electronics, Third Edition*, John Wiley & Sons, Inc., pp. 428–433, (1994).

Rao, K.V., et al., "Trench Capacitor Design Issues in VLSI DRAM Cells", *1986 IEEE International Electron Devices Meeting, Technical Digest*, Los Angeles, CA, 140–143, (Dec. 7–10, 1986).

Richardson, W.F., et al., "A Trench Transistor Cross–Point DRAM Cell", *IEEE International Electron Devices Meeting*, Washington, D.C., 714–717, (Dec. 1–4, 1985).

Sagara, K., et al., "A 0.72 micro–meter2 Recessed STC (RSTC) Technology for 256Mbit DRAMs using Quarter–Micron Phase–Shift Lithography", *1992 Symposium on VLSI Technology, Digest of Technical Papers*, Seattle, WA, 10–11, (Jun. 2–4, 1992).

Saito, M., et al., "Technique for Controlling Effective Vth in Multi–Gbit DRAM Sense Amplifier", *1996 Symposium on VLSI Circuits, Digest of Technical Papers*, Honolulu, HI, 106–107, (Jun. 13–15, 1996).

Seevinck, E., et al., "Current–Mode Techniques for High–Speed VLSI Circuits with Application to Current Sense Amplifier for CMOS SRAM's", *IEEE Journal of Solid State Circuits*, 26(4), pp. 525–536, (Apr. 1991).

Senthinathan, R., et al., "Reference Plane Parasitics Modeling and Their Contribution ot the Power and Ground Path "Effective" Inductance as Seen by the Output Drivers", *IEEE Transactions on Microwave Theory and Techniques*, 42, 1765–1773, (Sep. 1994).

Shah, A.H., et al., "A 4–Mbit DRAM with Trench–Transistor Cell", *IEEE Journal of Solid–State Circuits*, SC–21, 618–625, (Oct. 1986).

Shah, A.H., et al., "A 4Mb DRAM with Cross–Point Trench Transistor Cell", *1986 IEEE International Solid–State Circuits Conference, Digest of Technical Papers*, 268–269, (Feb. 21, 1986).

Sherony, M.J., et al., "Reduction of Threshold Voltage Sensitivity in SOI MOSFET's", *IEEE Electron Device Letters*, 16, 100–102, (Mar. 1995).

Shimomura, K., et al., "A 1V 46ns 16Mb SOI–DRAM with Body Control Technique", *1997 IEEE International Solid–State Circuits Conference, Digest of Technical Papers*, 68–69, (Feb. 6, 1997).

Stanisic, B.R., et al., "Addressing Noise Decoupling in Mixed–Signal IC's: Power Distribution Design and Cell Customization", *IEEE Journal of Solid–State Circuits*, 30, 321–326, (Mar. 1995).

Stellwag, T.B., et al., "A Vertically–Integrated GaAs Bipolar DRAM Cell", *IEEE Transactions on Electron Devices*, 38, 2704–2705, (Dec. 1991).

Su, D.K., et al., "Experimental Results and Modeling Techniques for Substrate Noise in Mixed Signal Integrated Circuits", *IEEE Journal of Solid State Circuits*, vol. SC–28, 420–30, (1993).

Suma, K., et al., "An SOI–DRAM with Wide Operating Voltage Range by CMOS/SIMOX Technology", *IEEE Journal of Solid–State Circuits*, 29(11), pp. 1323–1329, (Nov. 1994).

Sun, J., "CMOS Technology for 1.8V and Beyond", *Int'l Symp. on VLSI Technology, Systems and Applications: Digest of Technical Papers*, 293–297, (1997).

Sunouchi, K., et al., "A Surrounding Gate Transistor (SGT) Cell for 64/256Mbit DRAMs", *1989 IEEE International Electron Devices Meeting, Technical Digest*, Washington, D.C., 23–26, (Dec. 3–6, 1989).

Sunouchi, K., et al., "Process Integration for 64M DRAM Using an Asymmetrical Stacked Trench Capacitor (AST) Cell", *1990 IEEE International Electron Devices Meeting*, San Francisco, CA, 647–650, (Dec. 9–12, 1990).

Suntola, T., "Atomic Layer Epitaxy", *Handbook of Crystal Growth 3, Thin Films of Epitaxy, Part B: Growth Mechanics and Dynamics*, Elsevier, Amsterdam, 601–63, (1994).

Sze, S.M., *VLSI Technology*, 2nd Edition, Mc Graw–Hill, NY, 90, (1988).

Takai, M., et al., "Direct Measurement and Improvement of Local Soft Error Susceptibility in Dynamic Random Access Memories", *Nuclear Instruments & Methods in Physics Research*, B–99, 562–565, (Nov. 7–10, 1994).

Takao, Y., et al., "A 4–um(2) Full–CMOS SRAM Cell Technology for 0.2–um High Performance Logic LSIs", *1997 Symp. on VLSI Technology: Digest of Technical Papers*, Kyoto, Japan, 11–12, (1997).

Takato, H., et al., "High Performance CMOS Surrounding Gate Transistor (SGT) for Ultra High Density LSIs", *IEEE International Electron Devices Meeting, Technical Digest*, 222–225, (1988).

Takato, H., et al., "Impact of Surrounding Gate Transistor (SGT) for Ultra–High Density LSI's", *IEEE Transactions on Electron Devices*, 38, 573–578, (Mar. 1991).

Tanabe, N., et al., "A Ferroelectric Capacitor Over Bit–Line (F–COB) Cell for High Density Nonvolatile Ferroelectric Memories", *1995 Symposium on VLSI Technology, Digest of Technical Papers*, Kyoto, Japan, 123–124, (Jun. 6–8, 1995).

Temmler, D., "Multilayer Vertical Stacked Capacitors (MVSTC) for 64Mbit and 256Mbit DRAMs", *1991 Symposium on VLSI Technology, Digest of Technical Papers*, Oiso, 13–14, (May 28–30, 1991).

Terauchi, M., et al., "A Surrounding Gate Transistor (SGT) Gain Cell for Ultra High Density DRAMs", *1993 Symposium on VLSI Technology, Digest of Technical Papers*, Kyoto, Japan, 21–22, (1993).

Tsui, P.G., et al., "A Versatile Half–Micron Complementary BiCMOS Technology for Microprocessor–Based Smart Power Applications", *IEEE Transactions on Electron Devices*, 42, 564–570, (Mar. 1995).

Verdonckt–Vandebroek, S., et al., "High–Gain Lateral Bipolar Action in a MOSFET Structure", *IEEE Transactions on Electron Devices 38*, 2487–2496, (Nov. 1991).

Vittal, A., et al., "Clock Skew Optimization for Ground Bounce Control", *1996 IEEE/ACM International Conference on Computer–Aided Design, Digest of Technical Papers*, San Jose, CA, 395–399, (Nov. 10–14, 1996).

Wang, N., *Digital MOS Integrated Circuits*, Prentice Hall, Inc., Englewood Cliffs, NJ, p. 328–333, (1989).

Wang, P.W., et al., "Excellent Emission Characteristics of Tunneling Oxides Formed Using Ultrathin Silicon Films for Flash Memory Devices", *Japanese Journal of Applied Physics*, 35, 3369–3373, (Jun. 1996).

Watanabe, H., et al., "A New Cylindrical Capacitor Using Hemispherical Grained Si (HSG–Si) for 256Mb DRAMs", *IEEE International Electron Devices Meeting, Technical Digest*, San Francisco, CA, 259–262, (Dec. 13–16, 1992).

Watanabe, H., et al., "A Novel Stacked Capacitor with Porous–Si Electrodes for High Density DRAMs", *1993 Symposium on VLSI Technology, Digest of Technical Papers*, Kyoto, Japan, 17–18, (1993).

Watanabe, H., et al., "An Advanced Fabrication Technology of Hemispherical Grained (HSG) Poly–Si for High Capacitance Storage Electrodes", *Extended Abstracts of the 1991 International Conference on Solid State Devices and Materials*, Yokohama, Japan, 478–480, (1991).

Watanabe, H., et al., "Device Application and Structure Observation for Hemispherical–Grained Si", *J. Appl. Phys.*, 71, 3538–3543, (Apr. 1992).

Watanabe, H., et al., "Hemispherical Grained Silicon (HSG–Si) Formation on In–Situ Phosphorous Doped Amorphous–Si Using the Seeding Method", *Extended Abstracts of the 1992 International Conference on Solid State Devices and Materials*, Tsukuba, Japan, 422–424, (1992).

Watanabe, S., et al., "A Novel Circuit Technology with Surrounding Gate Transistors (SGT's) for Ultra High Density DRAM's", *IEEE Journal of Solid–State Circuits*, 30, 960–971, (Sep. 1995).

Yamada, T., et al., "A New Cell Structure with a Spread Source/Drain (SSD) MOSFET and a Cylindrical Capacitor for 64–Mb DRAM's", *IEEE Transactions on Electron Devices*, 38, 2481–2486, (Nov. 1991).

Yamada, T., et al., "Spread Source/Drain (SSD) MOSFET Using Selective Silicon Growth for 64Mbit DRAMs", *1989 IEEE International Electron Devices Meeting, Technical Digest*, Washington, D.C., 35–38, (Dec. 3–6, 1989).

Yoshikawa, K., "Impact of Cell Threshold Voltage Distribution in the Array of Flash Memories on Scaled and Multilevel Flash Cell Design", *1996 Symposium on VLSI Technology, Digest of Technical Papers*, Honolulu, HI, 240–241, (Jun. 11–13, 1996).

* cited by examiner

FIELD PROGRAMMABLE LOGIC ARRAYS WITH VERTICAL TRANSISTORS

This application is a divisional of U.S. Ser. No. 09/032,617, filed Feb. 27, 1998 now U.S. Pat. No. 6,124,729.

TECHNICAL FIELD OF THE INVENTION

This invention relates generally to integrated circuits and in particular to a field programmable logic array with vertical transistors.

BACKGROUND OF THE INVENTION

Logic circuits are an integral part of digital systems, such as computers. These devices present a problem to integrated circuit manufacturers, who cannot afford to make integrated logic circuits perfectly tailored to the specific needs of every customer. Instead, general purpose very large scale integration (VLSI) circuits are defined. VLSI circuits serve as many logic roles as possible, which helps to consolidate desired logic functions. However, random logic circuits are still required to tie the various elements of a digital system together.

Several schemes are used to implement these random logic circuits. One solution is standard logic, such as transistor-transistor logic (TTL). TTL integrated circuits are versatile because they integrate only a relatively small number of commonly used logic functions. The drawback is that large numbers of TTL integrated circuits are typically required for a specific application. This increases the consumption of power and board space, and drives up the overall cost of the digital system.

Other alternatives include fully custom logic integrated circuits and semicustom logic integrated circuits, such as gate arrays. Custom logic circuits are precisely tailored to the needs of a specific application. This allows the implementation of specific circuit architectures that dramatically reduces the number of parts required for a system. However, custom logic devices require significantly greater engineering time and effort, which increases the cost to develop these circuits and may also delay the production of the end system.

Semi-custom gate arrays are less expensive to develop and offer faster turnaround because the circuits are typically identical except for a few final-stage steps, which are customized according to the system design specifically. However, semi-custom gate arrays are less dense, so that it takes more gate array circuits than custom circuits to implement a given amount of random logic.

Between the extremes of general purpose devices on the one hand and custom and semi-custom gate arrays on the other, are programmable logic arrays (PLAs). PLAs which are programmable out in the field are known as field programmable logic arrays (FPLAs). FPLAs provide a more flexible architecture via user-programmed on-chip fuses or switches to perform specific functions for a given application. FPLAs can be purchased "off the shelf" like standard logic gates and are custom tailored like gate arrays in a matter of minutes.

To use FPLAs, system designers draft equations describing how the hardware is to perform, and enter the equations into a FPLA programming machine. The unprogrammed FPLAs are inserted into the machine, which interprets the equations and provides appropriate signals to the device to program the FPLA which will perform the desired logic function in the user's system.

Recently, FPLAs based on erasable-programmable-read-only memory cells (EPROMs) fabricated with CMOS (complimentary-metal-oxide-semiconductor) technology have been introduced. Such devices employ floating gate transistors as the FPLA switches, which are programmed by hot electron effects. The EPROM cells are erased by exposure to ultraviolet light or other means. EEPROMs (Electrically Erasable Programmable Read Only Memory) can be erased and programmed while in circuit using Fowler-Nordheim tunneling. However, a disadvantage of current EEPROMs is that they have a large cell size and require two transistors per cell. Herein is where the problem lies.

Technological advances have permitted semiconductor integrated circuits to comprise significantly more circuit elements in a given silicon area. To achieve higher population capacities, circuit designers strive to reduce the size of the individual circuit elements to maximize available die real estate. FPLAs are no different than the other circuit elements in that denser circuits are required to support these technological advances.

Increasing the storage capacity of FPLAs requires a reduction in the size of the transistors and other components in order to increase the logic array's density. However, density is typically limited by a minimum lithographic feature size (F) imposed by lithographic processes used during fabrication. For example, the present generation of high density FPLAs require an area of $8F^2$ per bit of data. Therefore, there is a need in the art to provide even higher density FPLAs to support the increased density of digital systems utilizing logic functions via semiconductor integrated circuits.

SUMMARY OF THE INVENTION

A field programmable logic array with vertical transistors is implemented for performing desired logic functions in a user's system. The field programmable logic array is programmed out in the field and is easily reprogrammed.

In one embodiment, a programmable logic array comprises an input having a plurality of input lines for receiving an input signal, an output having a plurality of output lines, one or more arrays having an AND plane and an OR plane connected between the input and the output, wherein the AND plane and the OR plane comprise a plurality of logic cells arranged in rows and columns for providing a sum-of-products term on the output lines responsive to the received input signal. Each logic cell includes at least a pair of transistors formed on opposing sides of a common pillar of semiconductor material that extends outwardly from a working surface of a substrate to form source/drain and body regions for the transistors. There are a number of floating gates, wherein each gate is associated with a side of the pillar. Also, there are a number of control lines, wherein each control line is associated with a floating gate.

In particular, a programmable logic array comprises an input having a plurality of input lines for receiving an input signal, a first array coupled to the input lines, the first array having a plurality of logic cells arranged in rows and columns for providing a product term responsive to the received input signal, and a second array having a plurality of logic cells arranged in rows and columns for receiving the product term and providing a sum term responsive to the product term, and an output having a plurality of output lines for receiving the sum term. Each logic cell includes at least a pair of transistors formed on opposing sides of a common pillar of semiconductor material that extends outwardly from a working surface of a substrate to form source/drain and body regions for the transistors. There are a number of floating gates, wherein each gate is associated with a side of the pillar. Also, there are a number of control lines, wherein each control line is associated with a floating gate.

In another illustrative embodiment, a programmable logic array comprises an array of logic cells, each logic cell including at least a pair of transistors formed on opposing sides of a common pillar of semiconductor material that forms source/drain and body regions for the transistors and at least a pair of floating gates disposed adjacent to the opposing sides of the pillar. At least one first source/drain interconnection line is formed, interconnecting one of the first source/drain regions of one of the logic cells. A plurality of output lines, each output line interconnecting one of the second source/drain regions of ones of the logic cells and a plurality of input lines for receiving an input signal are also formed, wherein the array of logic cells connected between the plurality of input lines and the plurality of output lines provides a logical combination responsive to the received input signal.

In another embodiment, a computer system comprises a programmable logic array having a plurality of input lines for receiving an input signal with a first array coupled to the input lines. The first array has a plurality of logic cells arranged in rows and columns for providing a product term responsive to the received input signal. A second array has a plurality of logic cells arranged in rows and columns for receiving the product term and providing a sum term responsive to the product term and an output having a plurality of output lines for receiving the sum term. Each logic cell includes at least a pair of transistors formed on opposing sides of a common pillar of semiconductor material that extends outwardly from a working surface of a substrate to form source/drain and body regions for the transistors, and a number of floating gates wherein each gate is associated with a side of the pillar, and a number of control lines wherein each control line is associated with a floating gate.

In yet another embodiment, a method of forming a programmable logic array is provided. The method includes several steps as described below. A plurality of first conductivity type semiconductor pillars are formed upon a substrate, each pillar having top and side surfaces. Next, a plurality of first source/drain regions are formed, of a second conductivity type, each of the first source/drain regions formed proximally to an interface between the pillar and the substrate. Forming a plurality of second source/drain regions, of a second conductivity type, each of the second source/drain regions formed within one of the pillars and distal to the substrate and separate from the first/source drain region. Forming a gate dielectric on at least a portion of the side surface of the pillars. A plurality of floating gates is formed, each of the floating gates formed substantially adjacent to a portion of the side surface of one of the pillars and separated therefrom by the gate dielectric. A plurality of control lines are formed, each of the control lines formed substantially adjacent to one of the floating gates and insulated therefrom, such that there are two control lines between the common pillars. An intergate dielectric is formed, which is interposed between one of the floating gates and one of the control lines. An intergate dielectric is formed, which is interposed between the two control lines located between the common pillars. A plurality of interconnecting lines is formed for interconnecting the control lines. At least one first source/drain interconnection line interconnecting one of the first source/drain regions is formed and a plurality of data lines are formed, each data line interconnecting one of the second/source drain regions.

In a still further embodiment, a method of forming a programmable logic array on a substrate is provided. The method comprises the steps of forming a first source/drain layer at a surface of the substrate. Then a semiconductor epitaxial layer on the first source/drain layer is formed. Next, a second source/drain layer at a surface of the epitaxial layer is formed. Etching is performed, in a first direction, for a plurality of substantially parallel first troughs in the epitaxial layer. The steps continue with forming an insulator in the first troughs, etching, in a second direction that is substantially orthogonal to the first direction, a plurality of substantially parallel second troughs in the epitaxial layer, forming a gate dielectric layer substantially adjacent to sidewall regions of the second troughs, and forming a conductive layer in the second troughs. A portion of the conductive layer is removed in the second troughs such that floating gate regions are formed along the sidewall regions therein and separated from the sidewall regions by the gate dielectric layer. Finally, the steps include forming an intergate dielectric layer on exposed portions of the floating gate regions in the second troughs, and forming control line regions between opposing floating gate regions in the second troughs and separated from the floating gate regions in the second troughs by the intergate dielectric layer.

In another embodiment, a method of forming a programmable logic array on a substrate is provided, comprising the steps of forming a first source/drain layer at a surface of the substrate, forming a semiconductor epitaxial layer on the first source/drain layer, forming a second source/drain layer at a surface of the epitaxial layer, etching, in a first direction, a plurality of substantially parallel first troughs in the epitaxial layer. The steps also include forming an insulator in the first troughs, etching, in a second direction that is substantially orthogonal to the first direction, a plurality of substantially parallel second troughs in the epitaxial layer, forming a gate dielectric layer substantially adjacent to sidewall regions of the second troughs, forming a conductive layer in the second troughs and removing a portion of the conductive layer in the second troughs such that floating gate regions are formed along the sidewall regions therein and separated from the sidewall regions by the gate dielectric layer. Finally, the following steps are performed. Forming an intergate dielectric layer on exposed portions of the floating gate regions in the second troughs, forming split control line regions between opposing floating gate regions in the second troughs, separating from the floating gate regions in the second troughs by the intergate dielectric layer, and separating the split control lines by the intergate dielectric layer.

Therefore, bulk semiconductor and semiconductor-on-insulator embodiments of the present invention provide a high density field programmable logic array. There are separate floating gates on opposite sides of a pillar constituting the transistor. Embodiments of the invention include a single control line located between floating gates or a split control line located between floating gates. If a floating gate of transistor data is used to represent a logic function, an area of only $2F^2$ is needed, where F is the minimum lithographic feature size. The programmability of the field programmable logic array is particularly advantageous for selecting desired logic functions in a digital system such as a computer without having to program a logic array with a mask. If a logic change needs to be made to the field programmable logic array, selected transistors in the logic array are simply reprogrammed. There is a need in the art to provide even higher density field programmable logic arrays to further support increased densities of digital systems utilizing logic functions via semiconductor integrated circuits.

A field programmable logic array implementing vertical transistors with either single or split control lines supports increased densities of digital systems. The logic function of the field programmable logic array is defined without having to actually mask the logic array. In different embodiments of the invention, bulk semiconductor, semiconductor-on-insulator, single control lines, split control lines and floating gates of varying scope are described. Still other and further embodiments, aspects and advantages of the invention will become apparent by reference to the drawings and by reading the following detailed description.

DETAILED DESCRIPTION OF THE INVENTION

Figure 1:
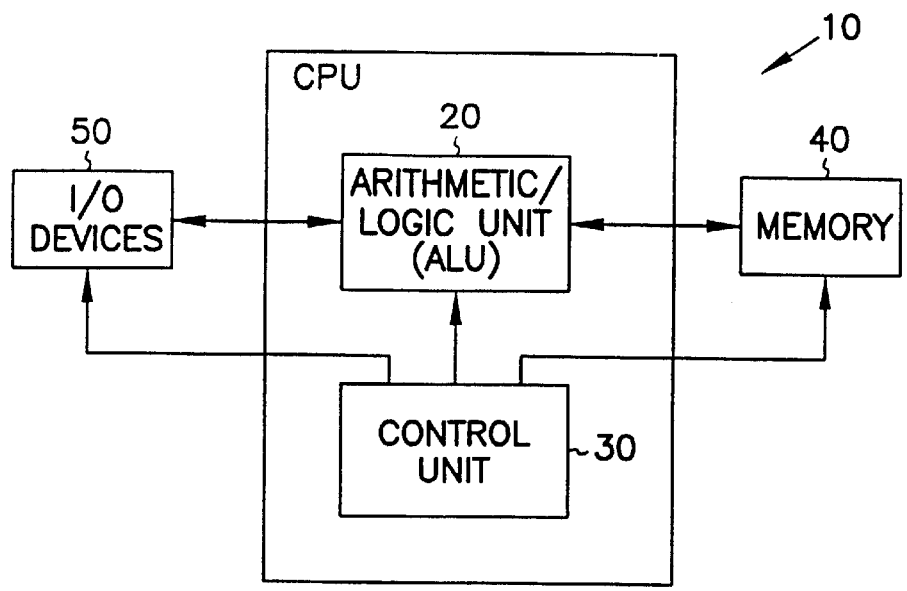
FIG. 1 is a simplified block diagram of a high-level organization of a digital computer.

In the following detailed description of the invention, reference is made to the accompanying drawings which form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The terms wafer and substrate used in the following description include any structure having an exposed surface with which to form the integrated circuit (IC) structure of the invention. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to include semiconductors, and the term insulator is defined to include any material that is less electrically conductive than the materials referred to as conductors. The following detailed description is, therefore, not to be taken in a limiting sense, and the scope of the present invention is defined only by the appended claims, along with the full scope of equivalents to which such claims are entitled.

FIG. 1 is a simplified block diagram of a high-level organization of a digital computer 10. A digital computer 10 is a system whose functional elements consist of an arithmetic/logic unit (ALU) 20, a control unit 30, a memory unit 40 and an input/output (I/O) device 50. Every computer system has a native set of instructions that specify operations to be performed on data by the ALU 20 and other interactions between the ALU 20, the memory unit 40 and the I/O devices 50. The memory units 40 contain the data plus a stored list of instructions.

The control unit 30 coordinates all operations of the ALU 20, the memory unit 40 and the I/O devices 50 by continuously cycling through a set of operations that cause instructions to be fetched from the memory unit 40 and executed. Field programmable logic arrays can be implemented to perform many of the logic functions performed by these components. With respect to the ALU 20, the control unit 30 and the I/O devices 50, arbitrary logic functions may be realized in the "sum-of-products" form that is well known to one skilled in the art. A logic function sum-of-products may be implemented using any of the equivalent two-level logic configurations: AND-OR, NAND-NAND, NOR-OR, OR-NOR, AND-NOR, NAND-AND or OR-AND.

Commercially available standard chips that are programmed to perform desired logic combinations are referred to as field programmable logic arrays. These chips provide varying numbers of inputs and outputs and product terms, depending on the particular logic function chosen.

Figure 2:
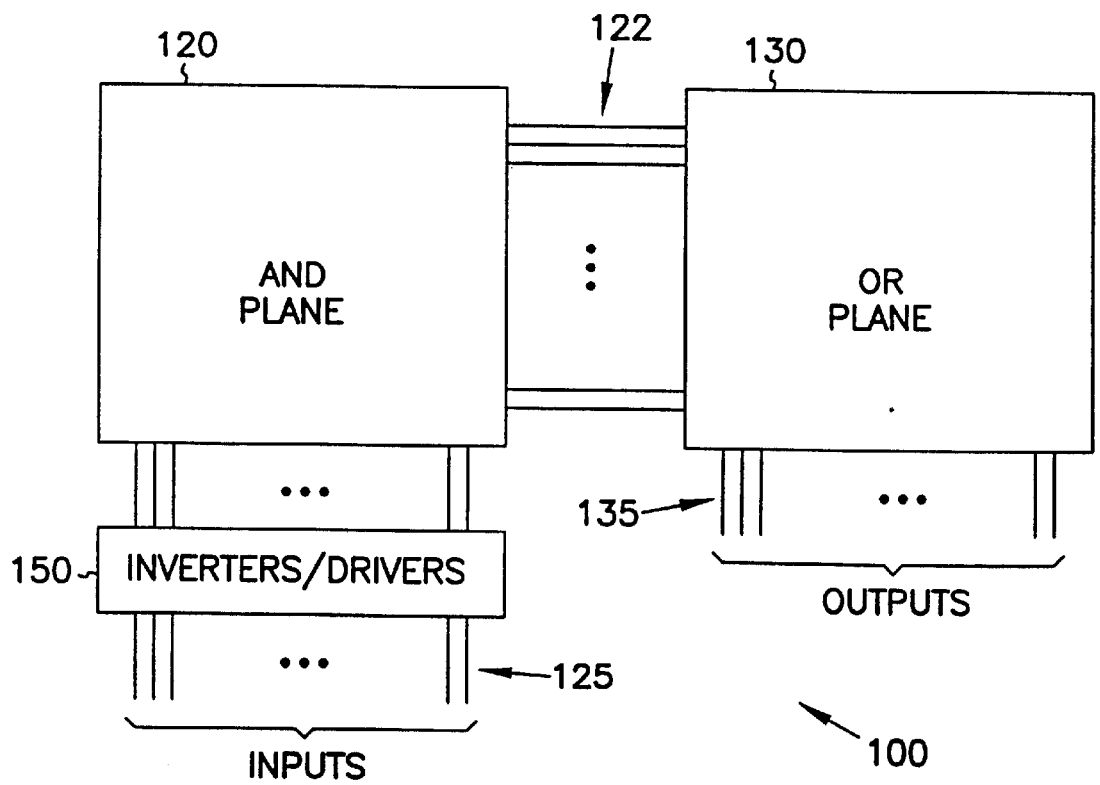
FIG. 2 is a simplified block diagram of a field programmable logic array.

FIG. 2 is a simplified diagram of a field programmable logic array 100. As is well known in the art, the two major constituents are an AND plane 120 and an OR plane 130. First, conjunctions of relevant combinations of input variables are applied to input lines 125, and their complements are computed. These outputs and their complements are provided to the OR plane 130 via interconnection lines 122.

Disjunctions of terms applied from the AND plane 120 are formed by the OR plane 130 and are provided as outputs on output lines 135. A third major constituent is a set of inverters X and drivers Y 150 capable of supplying the true and complemented value of each input variable applied to input lines 125.

In addition, various control circuits and signals not detailed herein initiate and synchronize the FPLA 100 operation as known to those skilled in the art. The description of the FPLA 100 has been simplified for purposes of illustrating the present invention and is not intended to be a complete description of all the features of a FPLA. The FPLA 100 implementation described herein is illustrative only and not intended to be exclusive or limiting.

Figure 3:
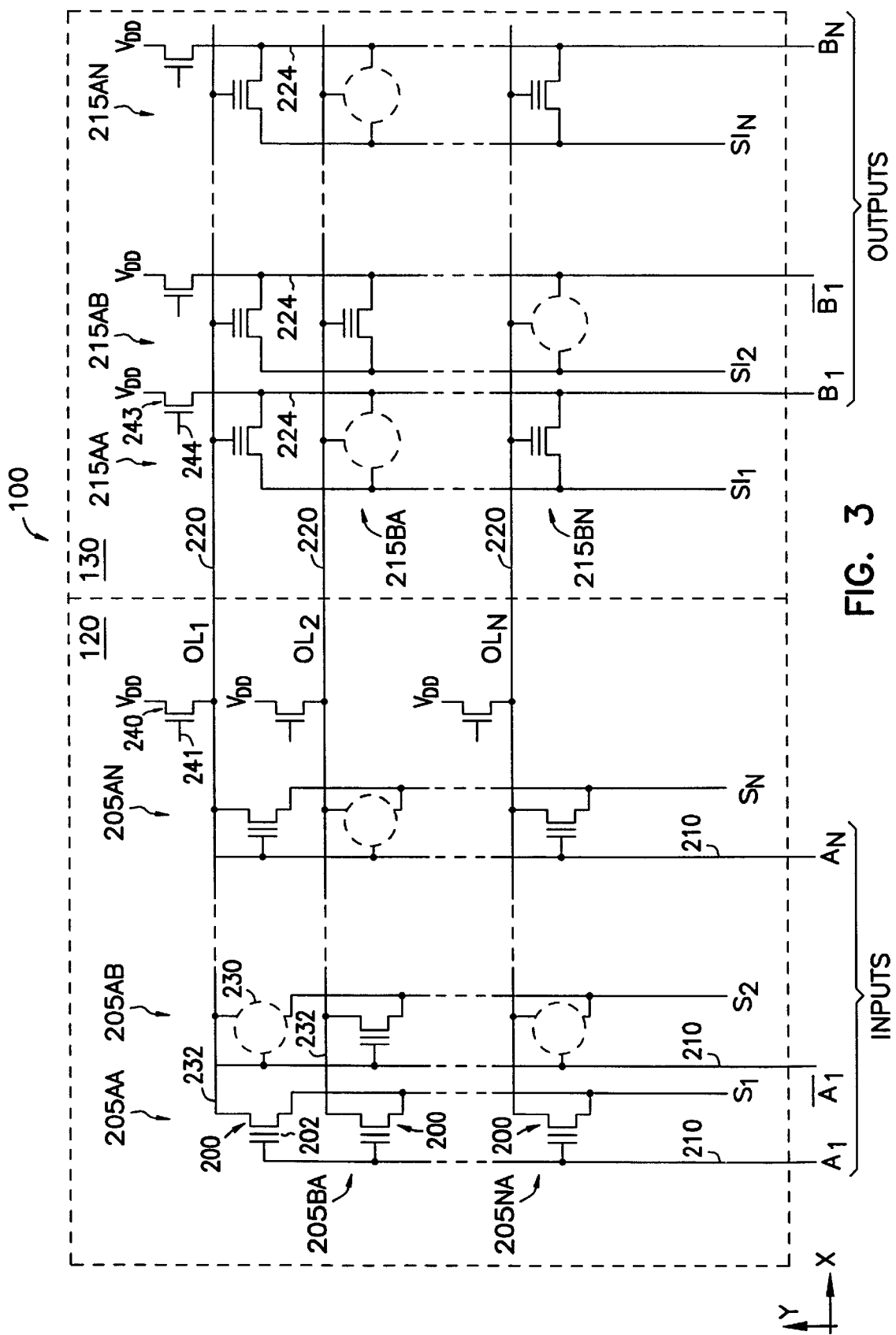
FIG. 3 is a schematic diagram illustrating generally an architecture of one embodiment of a field programmable logic array.

FIG. 3 is a schematic diagram illustrating generally an architecture of one embodiment of the field programmable logic array 100. It is well known to one skilled in the art that the field programmable logic array 100 is essentially a systematic way to implement a sum-of-products form of one or more logical functions of a set of input variables. Any arbitrary combination logic function can be realized using the sum-of-products form. For example, a sum-of-products may be implemented by using a two level logic configuration such as the NOR-NOR arrays 120, 130 shown in FIG. 3. Each of the programmable arrays 120, 130 are implemented with transistors 200 having floating gates 202.

The field programmable logic array 100 is made up of logic cells 205, 215. For array 120, transistors 200 are arranged in logic cells 205AA, 205BA, ..., 205NA in a first dimension, e.g., in the Y-dimension of the array 120 input lines $A_1$–$A_n$, and in logic cells 205AA, 205AB, ..., 205AN in a second dimension, e.g., in the X-dimension of the output lines $OL_1$–$OL_n$. Each logic cell 205 thus includes a transistor 200 having a floating gate 202, and one of the input lines $A_1$–$A_n$ for receiving input signals. Input lines $A_1$–$A_n$ are also referred to generally as a control line 210.

In a similar manner, array 130 comprises transistors 200 arranged in logic cells 215AA, 215AB, ..., 215AN in a first dimension, e.g., in the X-dimension of the array 130 input lines $OL_1$–$OL_n$, and in logic cells 215AA, 215BA, ..., 215NA in a second dimension, e.g., in the Y-dimension of the output lines $B_1$–$B_n$. Each logic cell 215 thus includes a transistor 200 having a floating gate 202, and a control line 220. Control line 220 is a general representation to the output lines $OL_1$–$OL_n$ from array 120 which serve as input lines to the array 130.

Because of the substantially identical nature of logic cells 205 and 215, only logic cell 205 is discussed in detail in the following paragraphs. One skilled in the art will readily recognize and understand the inter-relationships between sources $S_1$–$S_n$ and drain 224 connections of transistors 200 in array 120 with respect to those of array 130.

The transistor 200 is a floating gate transistor, which is a field-effect transistor (FET) having an electrically isolated (floating) gate 202 that controls electrical conduction between source regions $S_1$–$S_n$ and drain regions 224. Drain regions 224 are interconnected with output lines $OL_1$–$OL_n$. Source regions $S_1$–$S_n$ share a common ground for operation of the field programmable logic array 100. As an alternative embodiment to a common ground, sources $S_1$–$S_n$ do not share a common ground. By disconnecting the sources $S_1$–$S_n$ which are isolated from a substrate, the array 100 can be field programmed or erased and reprogrammed to accomplish the required logic functions.

The field programmable logic array 100 has input lines $A_1$–$A_n$ and output lines $B_1$–$B_n$. An N-input field programmable logic array reaches a limiting case when it has $2^n$ product terms. In this case, the field programmable logic array 100 is equivalent to a read only memory (ROM) with N address bits, and the first array would be identified as the ROM address decoder. However, the field programmable logic array 100 finds most effective use as a replacement for gate logic when the number of product terms is much smaller than $2^n$. Such a requirement is often found in the control units 30 of computers, as illustrated in FIG. 1. For example, a 32-bit very large scale integration (VLSI) computer instruction decoding unit uses a field programmable logic array of 26 inputs, 206 product terms and 22 outputs for decoding of instruction operation codes. A ROM with 26 input bits would have more than 67 million addresses, compared to only 206 product terms used in this example.

Programmability of the transistor 200 is achieved by charging the floating gate 202. When the floating gate 202 is charged, the transistor 200 remains in an off state until it is reprogrammed. Applying and removing a charge to the floating gate 202 is discussed in more detail within the following paragraphs. A transistor 200 in an off state is represented by a dotted circle 230 instead of actually displaying the full transistor. A transistor programmed in an off state remains in that state until the charge is removed from the floating gate 202.

Transistors 200 not having a corresponding floating gate 202 charged are fully illustrated in FIG. 3. These transistors 200 operate in either an on state or an off state, wherein input signals received by the input lines $A_1$–$A_n$ determine the applicable state. Each transistor 200 has a source and drain region fabricated using a semiconductor pillar on a substrate. The sources $S_1$–$S_n$ are connected to a common ground for all transistors 200 and a drain 232 is an output line, e.g., $OL_1$.

If any transistor 200 is turned on, then a ground is provided to pull up transistor 240. The pull up transistor 240 is attached to an output line, e.g., $OL_n$. The pull up transistor 240 provides a low voltage level when any one of the transistors 200 connected to the corresponding output line is activated. When the transistor 200 is in an off state, an open is provided to the source of the pull up transistor 240. The $V_{DD}$ voltage level is applied to corresponding input lines 220 of array 130 when the pull up transistor 240 is turned on by a clock signal received by input 241.

In a similar fashion, if the transistors 200 in array 130 are turned on via array 120, then a ground is provided to a pull up transistor 243. The pull up transistors 243 are attached to a corresponding output line, e.g., $B_n$. The pull up transistor 243 provides a low voltage level when any one of the transistors 200 connected to the corresponding output line is activated. When the transistor 200 is in an off state, an open is provided to the source of the pull up transistor 243. The $V_{DD}$ voltage level is applied to the output lines $B_1$–$B_n$ of array 130 when the pull up transistor 243 is turned on by a clock signal received by input line 244.

Figure 4A:
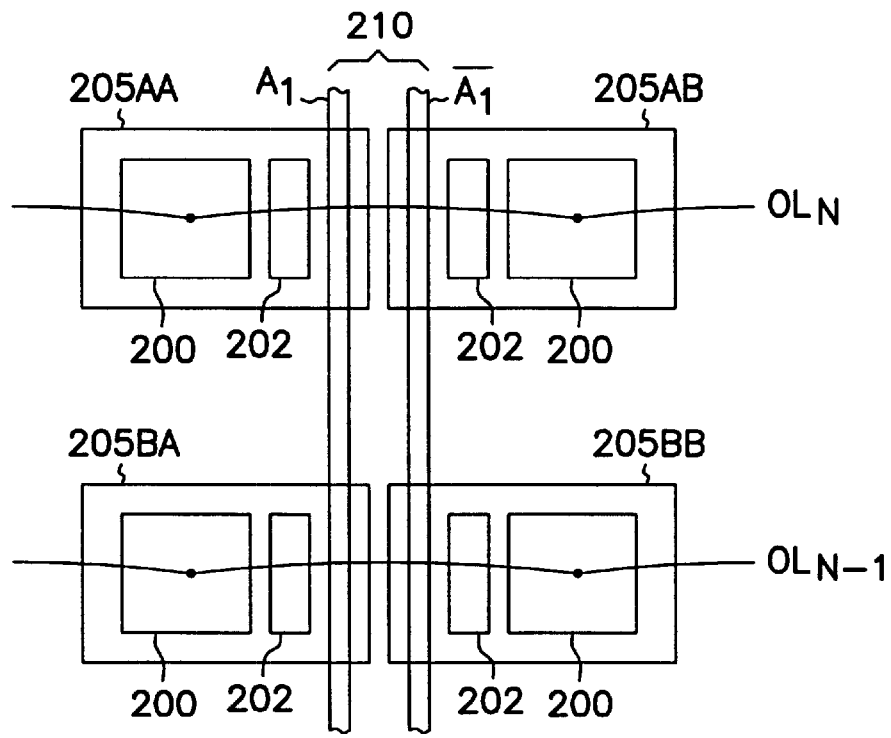
FIG. 4A illustrates a top view of a portion of an array of logic cells having a split control line.
Figure 4B:
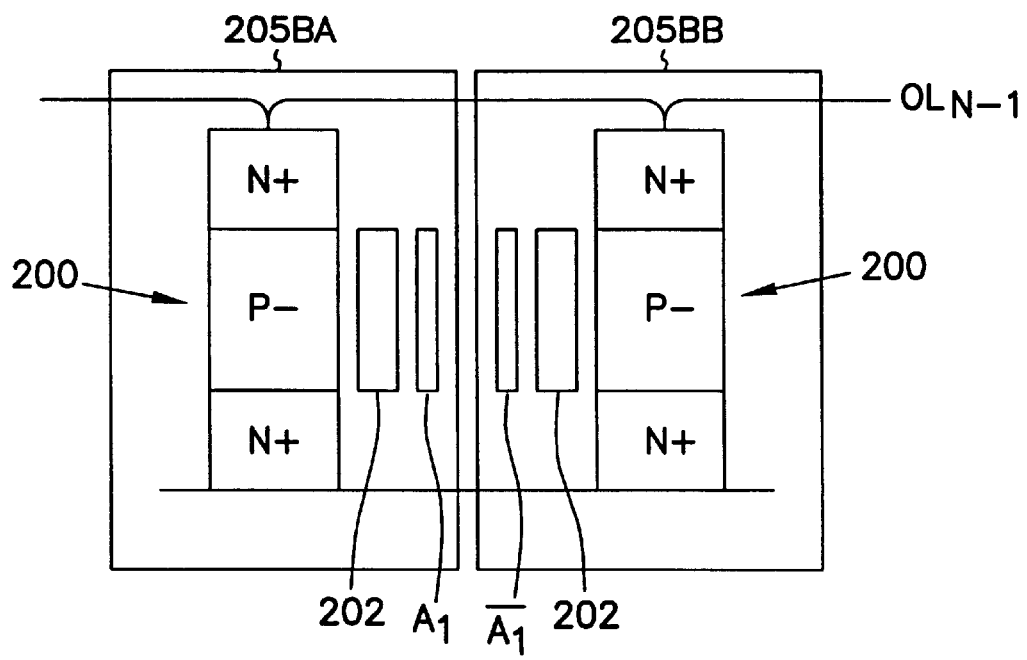
FIG. 4B illustrates a front view of a portion of an array of logic cells having a split control line.

FIGS. 4A and 4B illustrate a top view and a front view, respectively, of logic cells 205AA, 205BA, 205AB and 205BB having a split control line 210, e.g., $A_1$ and inverted $A_1$. As previously stated, control lines 210 are a general reference to the array 120, 130 input lines $A_1$–$A_n$ and $OL_1$–$OL_n$, respectively. The advantage of split control lines is that only one transistor 200 is required per logic cell 205. Since the split control lines 210 are isolated from each other, this allows a single transistor to be selected.

Figure 5A:
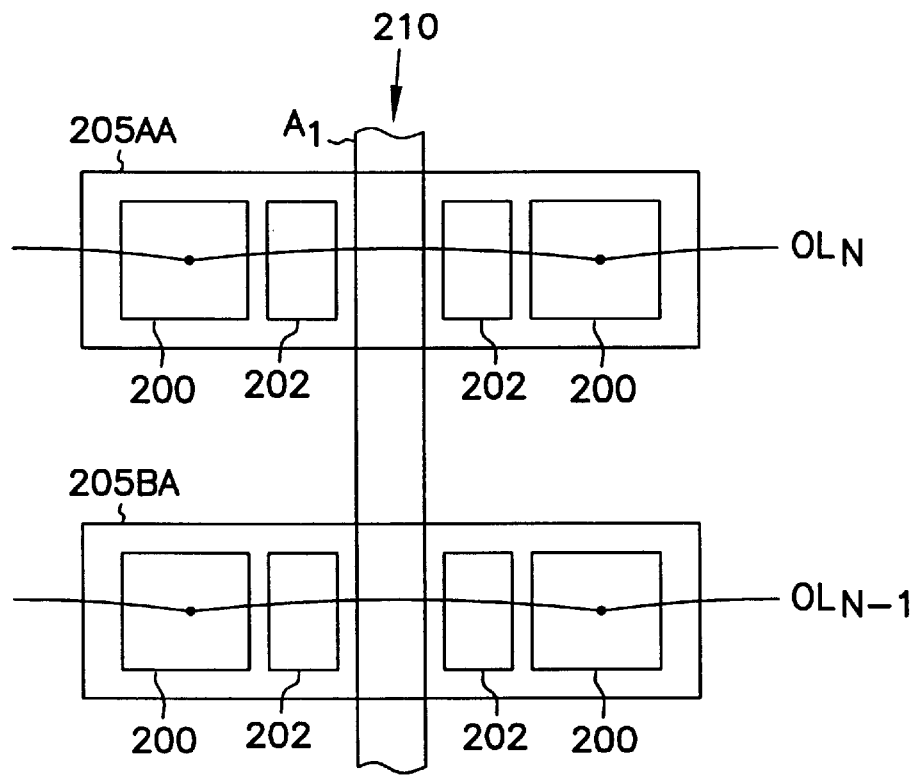
FIG. 5A illustrates a top view of an alternative embodiment of the array of logic cells of FIG. 4A having a single control line.
Figure 5B:
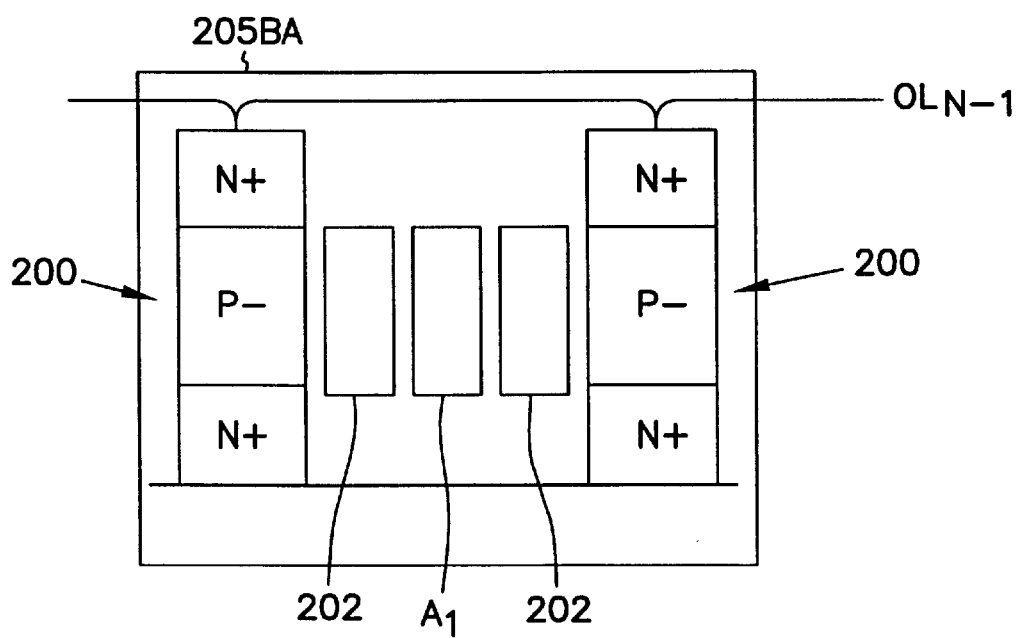
FIGS. 5B illustrates a front view of an alternative embodiment of the array of logic cells of FIG. 4A having a single control line.

FIGS. 5A and 5B illustrate a top view and a front view, respectively, of an alternative embodiment of logic cells 205AA and 205BA of FIG. 4A having a single control line, e.g., $A_1$. When single control line $A_1$ is high, the two transistors 200 on each side of the control line 210 are activated at the same time. The advantage is that there is redundancy in the selection of an output, but the drawback is the loss of circuit density because of the duplication.

Figure 6A:
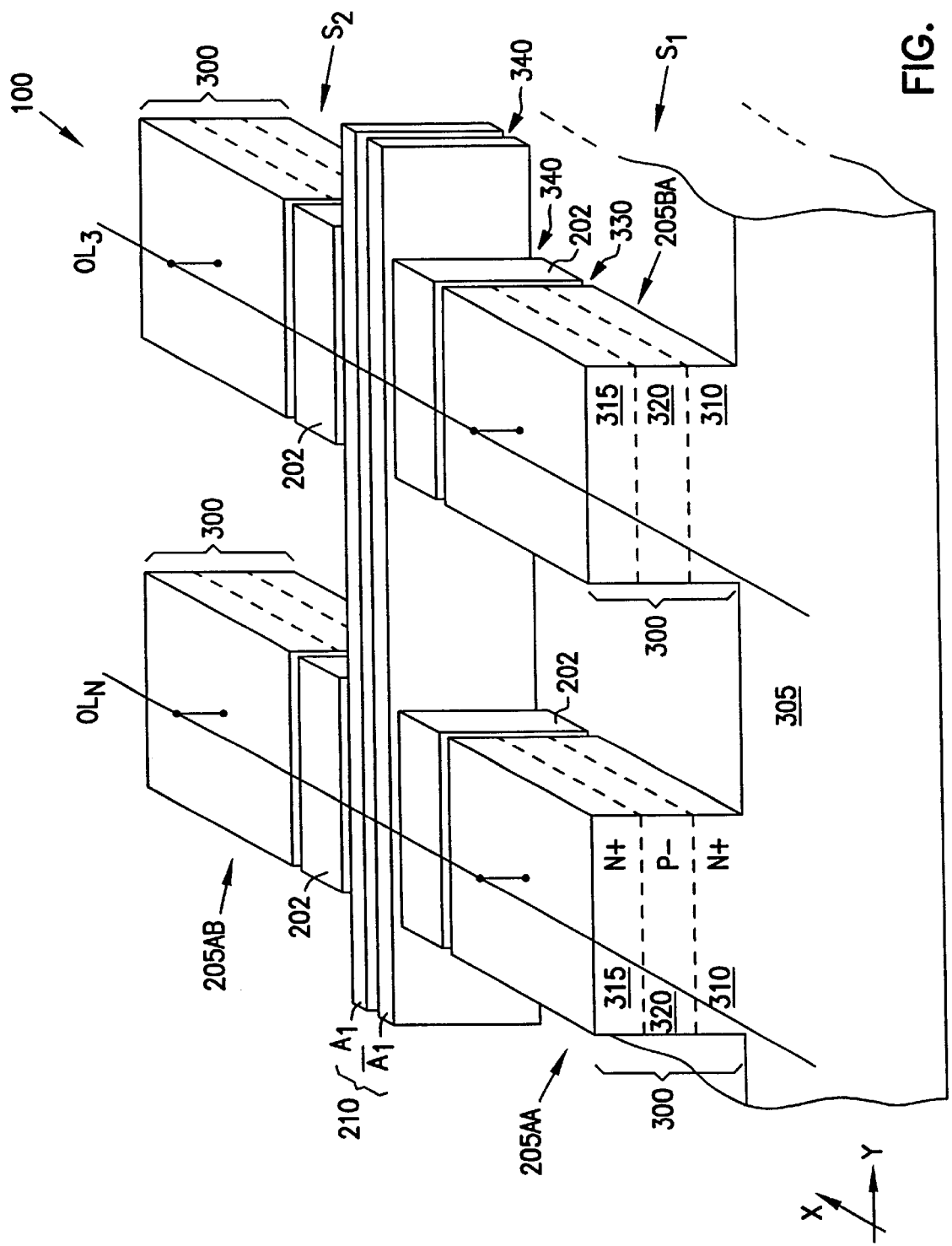
FIG. 6A is a perspective view illustrating generally one embodiment of a completed field programmable logic array, including portions of four transistors having split control lines.

FIG. 6A is a perspective view illustrating generally one embodiment of a completed field programmable logic array 100, including portions of four transistors 200 having split control lines 210, such as illustrated in FIGS. 4A and 4B. In FIG. 6A, the substantially identical transistors are illustrated by way of example through logic cells 205AA, 205BA, 205AB and 205BB. Each logic cell 205 includes a semiconductor pillar 300, initially of a first conductivity type such as P– silicon, fabricated upon a monolithic substrate 305. In one embodiment, substrate 305 is a bulk semiconductor, such as P– silicon. In another embodiment, a semiconductor-on-insulator (SOI) substrate 305 includes an insulating layer, such as silicon dioxide ($SiO_2$), as described below.

Each pillar 300 includes a first source/drain region of a second conductivity type, such as N+ silicon source region 310, formed proximally to a sub-micron dimensional interface between pillar 300 and substrate 305. Each pillar 300 also includes a second source/drain region of the second conductivity type, such as N+ silicon drain region 315, that is distal to substrate 305, and separated from source region 310 by a first conductivity type region, such as P– body region 320.

Each pillar 300 provides a source region 310, a drain region 315, and a body region 320 for floating gate transistor 200 of a particular logic cell, e.g., 205AA. In one embodiment, the physical dimensions of each pillar 300 and the doping of P– body region 320 are both sufficiently small to allow operation of the floating gate transistors 200 that is characteristic of fully depleted body transistors. First source/drain region interconnection lines $S_1$–$S_N$ electrically interconnects the source region 310 of each pillar 300 of cells.

In one embodiment, the first source/drain interconnection lines $S_1$–$S_N$ comprise a conductively doped semiconductor of the second conductivity type, such as N+ silicon, disposed at least partially within substrate 305. For example, dopants can be ion-implanted or diffused into substrate 305 to form the first source/drain interconnection lines $S_1$–$S_N$.

In another embodiment, the first source/drain interconnection lines $S_1$–$S_N$ are formed above substrate 305. For example, a doped epitaxial semiconductor layer can be grown on substrate 305, from which first source/drain interconnection lines $S_1$–$S_N$ are formed. Alternatively, an undoped epitaxial semiconductor layer can be grown on substrate 305, and dopants then introduced by ion-implantation or diffusion to obtain the first source/drain interconnection lines $S_1$–$S_N$ of the desired conductivity.

Each pillar 300 is outwardly formed from substrate 305, and is illustrated in FIG. 6A as extending vertically upward from substrate 305. Each pillar 300 has a top region that is separated from substrate 305 by four surrounding side regions. A floating gate 202 is formed substantially adjacent to two opposing side surfaces of pillar 300, and separated therefrom by a gate dielectric 330, such that there are two floating gates 202 per pillar 300, though FIG. 6A omits some of the floating gates 202 for clarity of illustration.

Each floating gate 202 has a corresponding substantially adjacent control line 210 from which it is separated by an intergate dielectric 340. Except at the periphery of array 100, there are two control lines 210 interposed between two approximately adjacent pillars 300. For example, in FIG. 6A, input $A_1$ and inverted $A_1$ are interposed between logic zones 205AA, 205BA on one side and logic zones 205AB and 205BB on the other side. Input $A_1$ controls logic zones 205AA and 205BA while inverted line input $A_1$ controls logic zones 205AB and 205BB. Input $A_1$ and inverted $A_1$ are separated by an intergate dielectric 340.

In the single control line embodiment, a single control line 210 controls the two transistors 200 on each side of the control line, e.g., input $A_1$. A logic cell 205 has two transistors 200 operated from a single control line 210, as shown in FIG. 4B. This is in contrast to the split control line 210 embodiment where only one transistor 200 is operated by a single control line 210.

Control lines 210 are interposed between approximately adjacent pillars 300, wherein the input lines $A_1$–$A_n$ are substantially parallel to each other. In this embodiment, input lines $A_1$–$A_n$ are illustrated as running in the Y-dimension, e.g. perpendicular to output lines $OL_1$–$OL_n$. Each of the input lines $A_1$–$A_n$ interconnects a plurality of transistors 200. For example, input line $A_1$ electrically interconnects the floating gate 202 of logic cells 205AA–205NA. Having split control lines 210 allows the floating gates 202 to be independent between pairs of logic cells, 205AA and 205AB, 205BA and 205BB, . . . , 205AN and 205BN. In the embodiment of FIG. 6A, input lines $A_1$–$A_n$ are disposed above substrate 305, as described below.

Drain regions 315 of the pillars 300 are interconnected by output lines $OL_1$–$OL_n$ that are substantially parallel to each other in the X-dimension, e.g. perpendicular to input lines $A_1$–$A_n$. FIG. 6A illustrates, by way of example, output lines $OL_1$ and $OL_{n-1}$, which are shown schematically for clarity. However, it is understood that output lines $OL_1$–$OL_n$ comprise metal or other interconnection lines that are isolated from the underlying topology, e.g. pillars 300, floating gates 202, control lines $A_1$–$A_n$ and output lines $OL_1$–$OL_n$ by an insulating layer through which contact holes are etched to access the drain regions 315 of the pillars 300.

Figure 6B:
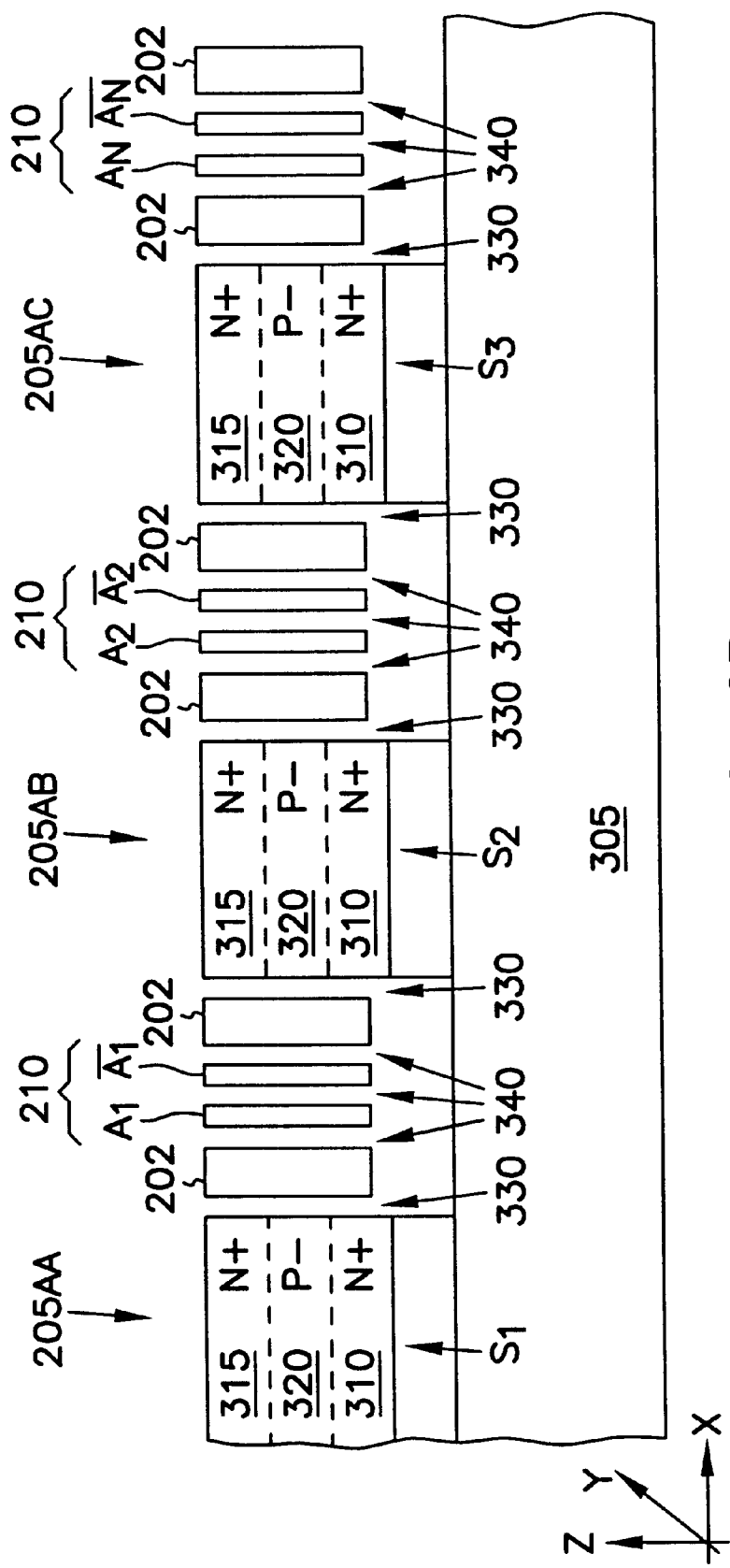
FIG. 6B is a cross-sectional view of the completed field programmable logic array of FIG. 6A looking perpendicular to output lines $OL_1$–$OL_n$.

FIG. 6B is a cross-sectional view of FIG. 6A looking in the Y-dimension, e.g. perpendicular to output lines $OL_1$–$OL_n$. FIG. 6B illustrates a row of logic cells 205AA, 205AB, . . . , 205AN, having source regions 310 interconnected by one of first source/drain interconnection lines $S_1$, $S_2$, . . . , $S_N$.

Figure 7:
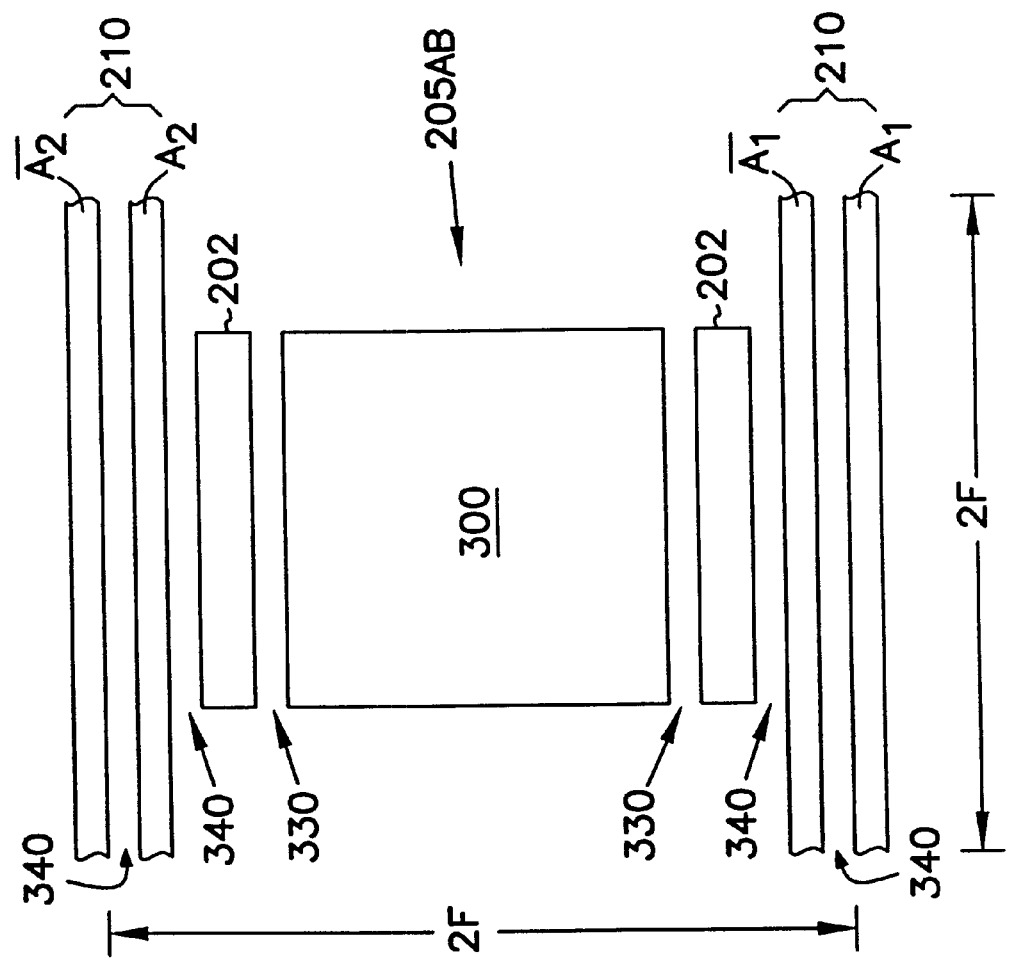
FIG. 7 is a plan view looking toward the working surface of a substrate, illustrating generally by way of example one embodiment of a logic cell.

FIG. 7 is a plan view looking toward the working surface of substrate 305, illustrating generally by way of example one embodiment of logic cell 205AB. Each of the two floating gates 202 is adjacent to one of opposing sides of pillar 300, and separated therefrom by gate dielectric 330. Each control line 210 is separated from a corresponding floating gate 202 by an intergate dielectric 340. The control lines 210 are likewise separated by intergate dielectric 340. Each control line 210 is integrally formed together with one of the input lines $A_1$–$A_n$.

The center-to-center spacing ("pitch") between control lines 210 that are on opposite sides of pillar 300 is twice the minimum lithographic feature size F. Since two floating gate transistors 200 are contained within a logic cell 205 having an area of $4F^2$, an area of only $2F^2$ is needed per logic cell.

In one embodiment, programming of one of the floating gate transistors 200 is by hot electron injection. For example, a voltage of approximately 10 volts is provided to a particular one of input lines $A_1$, $A_2$, . . . , $A_n$ adjacent to a particular floating gate 200. A resulting inversion region (channel) is formed in the body region 320 at the surface that is approximately adjacent to the particular one of the input lines $A_1$–$A_n$. A voltage of approximately 10 Volts is provided through a particular one of output lines $OL_1$–$OL_n$ to a particular drain region 315. A voltage of approximately 0 Volts is provided, through a particular one of first source/drain interconnection lines $S_1$–$S_N$, to the particular source region 310 of the floating gate transistor 200.

Electrons are injected onto the floating gate 202 interposed between the control line 210 and the pillar 300 in which the particular drain region 315 is disposed. The exact value of the voltages provided to the particular control line 210 and drain region 315 will depend on the physical dimension of the floating gate transistor 200, including the thickness of the gate dielectric 330, the thickness of the intergate dielectric 340, and the separation between source region 310 and drain region 315. Alternatively, if higher voltages are provided to the control line 210, and the gate dielectric 330 and intergate dielectric 340 are made thinner, the floating gate transistor 200 may be programmed instead by Fowler-Nordheim tunneling of electrons from the body region 320, source region 310, or drain region 315.

In one embodiment, reading data stored on a particular floating gate transistor 200 includes providing a voltage of approximately 5 volts through a particular one of the input lines $A_1$, $A_2$, . . . , $A_n$ to a particular control line 210 of the floating gate transistor 200. A voltage of approximately 0 Volts is provided common ground $S_1$, $S_2$, . . . , $S_N$ to the particular source region 310 of the particular floating gate transistor 200. A particular one of output lines $OL_1$–$OL_n$ that is switchably coupled to the drain region 315 of the floating gate transistor 200 is precharged to a positive voltage by a pull up transistor, then coupled to the drain region 315 to determine the conductivity state of the floating gate transistor 200 between its source region 310 and drain region 315.

If there are no electrons stored on the floating gate 202, the floating gate transistor 200 will conduct between its source region 310 and drain region 315, decreasing the voltage of the particular one of output lines $OL_1$–$OL_n$ toward that voltage of its source region 310, e.g. toward a "low" binary logic level voltage of approximately 0 Volts. If there are electrons stored on the floating gate 202, the floating gate transistor 200 will not conduct between its source region 310 and drain region 315. As a result, pull up transistor 240 will tend to increase the voltage of the particular one of output lines $OL_1$–$OL_n$ toward a positive voltage, e.g. toward a "high" binary logic voltage level.

In one embodiment, erasure of floating gate transistors 200 includes providing an erasure voltage difference of approximately between 10 and 12 Volts from a source region 310 to a corresponding control line 210. For example, a voltage of approximately 0 Volts is provided to source regions 310 of floating gate transistors 200 that are interconnected by one or several first source/drain interconnection lines $S_1$, $S_2$, . . . , $S_N$. A voltage of approximately between 10 and 12 Volts is provided through a corresponding one or several of the input lines $A_1$–$A_n$ to the control lines 210 of the floating gate transistors 200 to be erased. As a result of the negative voltage applied to the control lines 210, electrons are removed from the corresponding floating gates 202 by Fowler-Nordheim tunneling, thereby removing the charge from one of the floating gate transistors 200.

In another example, a voltage of approximately between –5 and –6 Volts is applied to the control lines 210 and a voltage of approximately between +5 and +6 Volts is applied to the source regions 310 in order to obtain the erasure voltage difference of approximately between –10 and –12 Volts from a source region 310 to a corresponding control line 210. The exact value of the erasure voltage difference will vary depending upon the physical dimensions of the floating gate transistor 200 and the thicknesses of gate dielectric 330 and intergate dielectric 340.

In one embodiment, an entire row of floating gate transistors 200 is simultaneously erased by applying approximately between –10 and –12 Volts to each of inputs $A_1$–$A_n$, and also applying 0 Volts to each of first source/drain interconnection lines $S_1$, $S_2$, . . . , $S_N$. In another embodiment, one or more sectors of a row are simultaneously erased by selectively applying approximately between –10 and –12 Volts to one or more of input lines $A_1$–$A_n$ and also applying 0 Volts to one or more of first source/drain interconnection lines $S_1$, $S_2$, . . . , $S_N$.

FIGS. 8–16 illustrate generally one embodiment of a method of forming field programmable logic array 100. In this embodiment, field programmable logic array 100 is formed using bulk silicon processing techniques and is described, by way of example, with respect to a particular technology having a minimum lithographic feature size F, which is also sometimes referred to as a critical dimension (CD), of 0.4 microns. However, the process steps described below can be scaled accordingly for other minimum feature sizes without departing from the scope of the invention.

The term "horizontal" as used in this application is defined as a plane parallel to the conventional plane or surface of a wafer or substrate, regardless of the orientation of the wafer or the substrate. The term "vertical" refers to a dimension perpendicular to the horizontal as defined above. Prepositions, such as "on," "side," (as in sidewall), "higher," "lower," "over," and under are defined with respect to the conventional plane or surface being on the top surface of the wafer or substrate, regardless of the orientation of the wafer or substrate.

Figure 8:
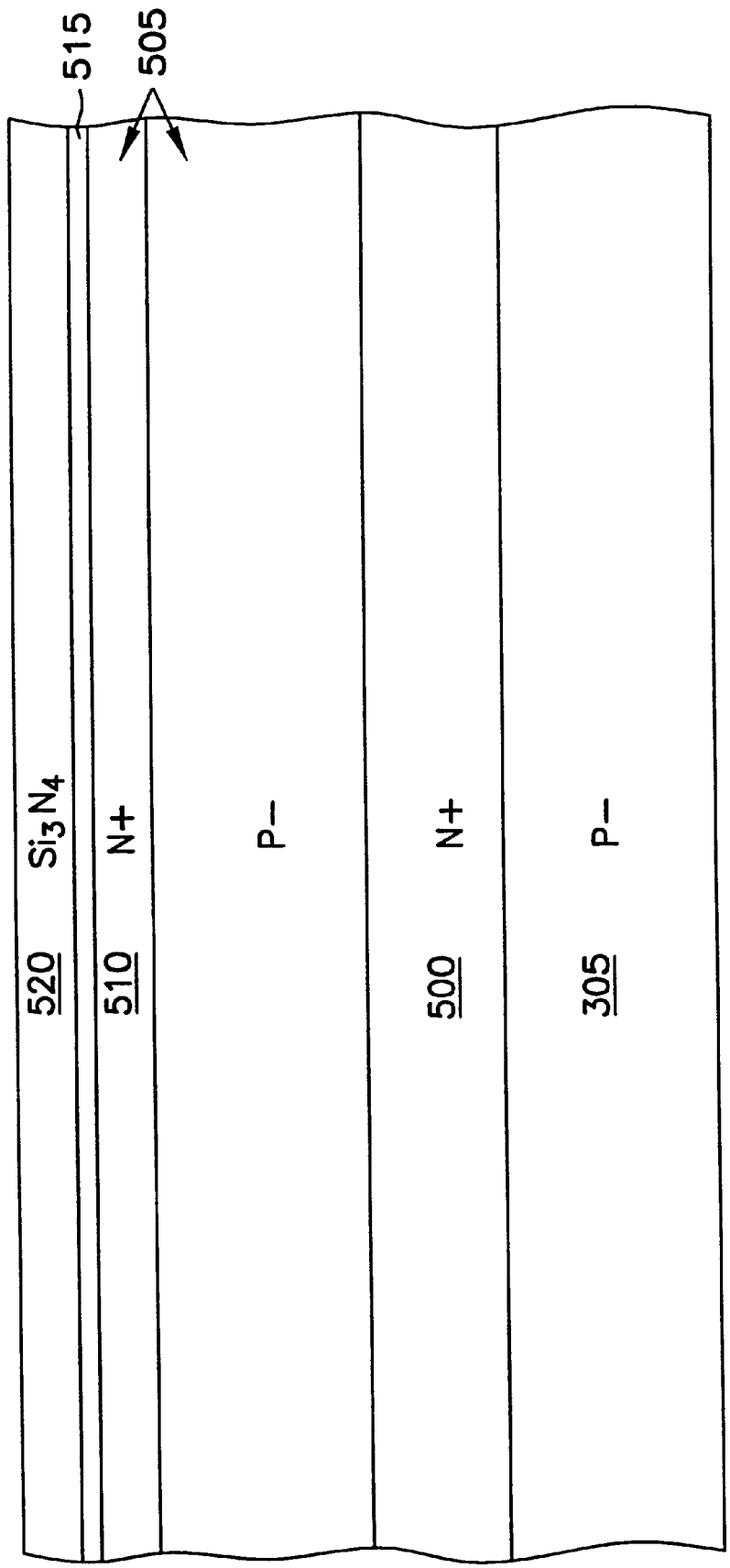
FIG. 8 illustrates a side view of a substrate material having a plurality of source/drain layers on top of the substrate material for forming a field programmable logic array.

In FIG. 8, a P– silicon starting material is used for substrate 305. A first source/drain layer 500, of approximate thickness between 0.2 microns and 0.5 microns, is formed at a working surface of substrate 305. In one embodiment, first source/drain layer 500 is N+ silicon formed by ion-implantation of donor dopants into substrate 305. In another embodiment, first source/drain layer 500 is N+ silicon formed by epitaxial growth of silicon upon substrate 305. On the first source/drain layer 500, a semiconductor epitaxial layer 505, such as P– silicon of 0.6 micron approximate thickness, is formed, such as by epitaxial growth.

A second source/drain layer 510, such as N+ silicon of 150 nanometers approximate thickness, is formed at a surface of the epitaxial layer 505, such as by ion-implantation of donor dopants into P– epitaxial layer 505 or by epitaxial growth of N+ silicon on P– epitaxial layer 505. A thin layer of silicon dioxide ($SiO_2$), referred to as pad oxide 515, is deposited on the second source/drain layer 510. Pad oxide 515 has a thickness of approximately 10 nanometers. A layer of silicon nitride ($Si_3N_4$), referred to as pad nitride 520, is deposited on the pad oxide 515. Pad nitride 520 has a thickness of approximately 100 nanometers.

Figure 9:
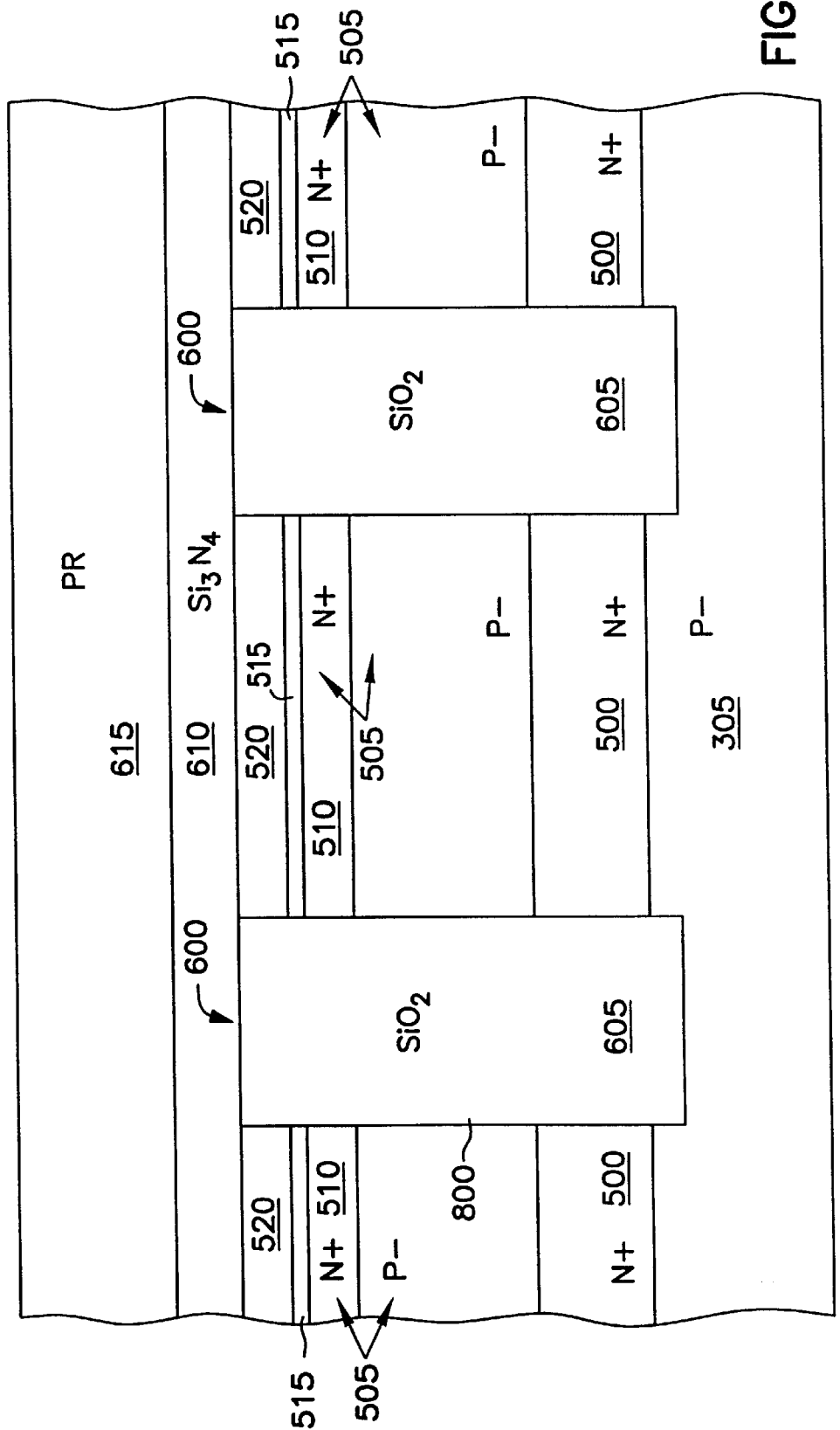
FIG. 9 illustrates a plurality of parallel first troughs extending through a plurality of layers formed on top of a substrate material.

In the bulk silicon embodiment of FIG. 9, photoresist masking and selective etching techniques are used to form, in the first dimension (e.g., the Y-dimension, which is perpendicular to the plane of the drawing of FIG. 9), a plurality of substantially parallel first troughs 600 that extend through the pad nitride 520, pad oxide 515, second source/drain layer 510, the underlying portion of epitaxial layer 505, first source/drain layer 500, and at least partially into underlying P– silicon substrate 305.

The photoresist is then removed by conventional photoresist stripping techniques, and an insulator 605, such as silicon dioxide deposited by chemical vapor deposition (CVD), is formed to fill first troughs 600. The insulator 605 is planarized (e.g. exposing underlying portions of pad nitride 520) such as by chemical mechanical polishing (CMP) or other suitable planarization technique. A masking layer 610 such as, for example, silicon nitride deposited by CVD and having an approximate thickness of 200 nanometers, is then formed on insulator 605 and elsewhere on the working surface of substrate 305. A photoresist layer 615 is then formed on masking layer 610.

Figure 10:
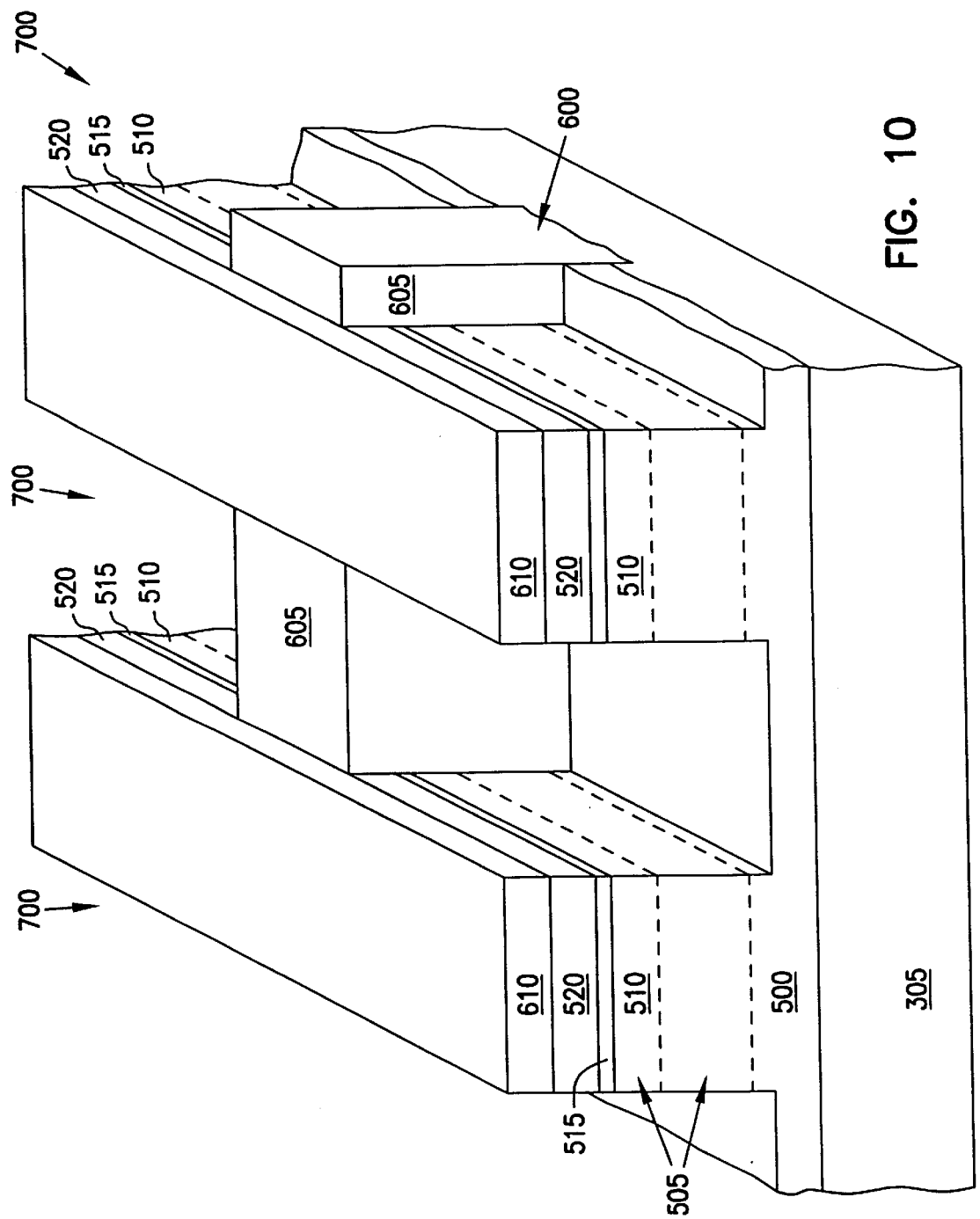
FIG. 10 is a perspective view of a plurality of parallel second troughs orthogonal to the first troughs illustrated in FIG. 9.

FIG. 10 is a perspective view, illustrating the selective etching, in a second dimension (X-dimension) that is substantially orthogonal to the first dimension (Y-dimension), of a plurality of substantially parallel second troughs 700, as described below. Forming second troughs 700 includes patterning photoresist layer 615, selectively etching masking layer 610, pad nitride 520, and underlying pad oxide 515, such that portions of silicon dioxide insulator 605 in the second troughs 700 are exposed, together with N+ silicon second source/drain layer 510. A selective etch, which preferentially removes silicon but doesn't substantially remove silicon dioxide, is used to etch through the exposed portions of second source/drain layer 510, the underlying portions of epitaxial layer 505, and approximately 100 nanometers into the underlying portions of first source/drain layer 500. Photoresist 615 is then removed by conventional photoresist stripping techniques, leaving the structure illustrated in FIG. 10.

Figure 11:
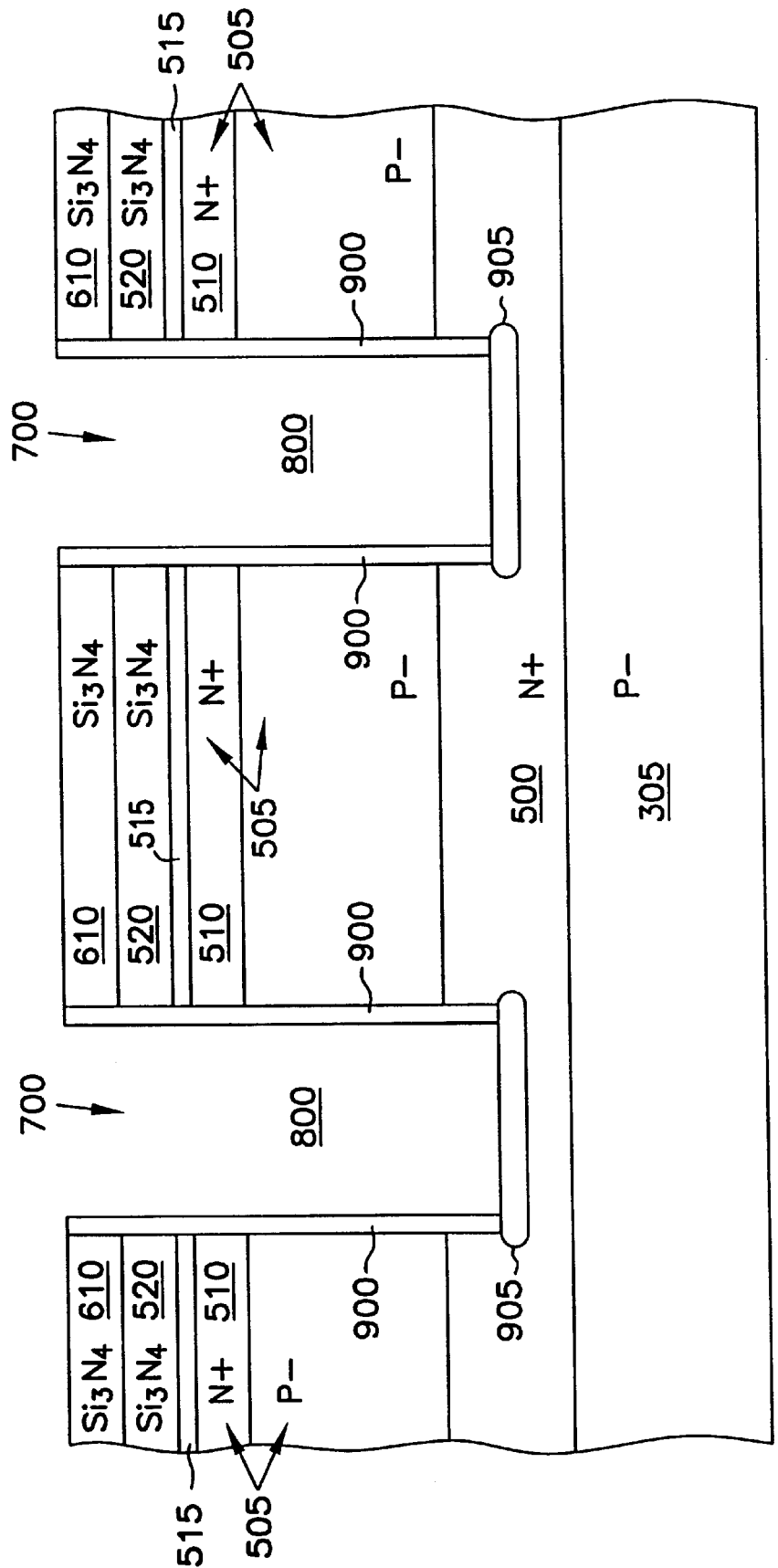
FIG. 11 is a cross-sectional view looking in the direction of the second troughs illustrated in FIG. 10.

FIG. 11 is a cross-sectional view looking in the direction of second troughs 700 (e.g. such that the X-dimension is orthogonal to the plane of the illustration of FIG. 11). In FIG. 11, a thin oxidation barrier layer 900, such as silicon nitride of approximate thickness of 20 nanometers, is conformally deposited by CVD to protect against the oxidation of sidewalls of second troughs 700. Barrier layer 900 is anisotropically etched to expose bottom portions of second troughs 700. A bottom insulation layer 905 is formed on the bottoms of second troughs 700, such as silicon dioxide of approximate thickness of 100 nanometers formed by thermal oxidation of the exposed bottom portions of second troughs 700.

Figure 12:
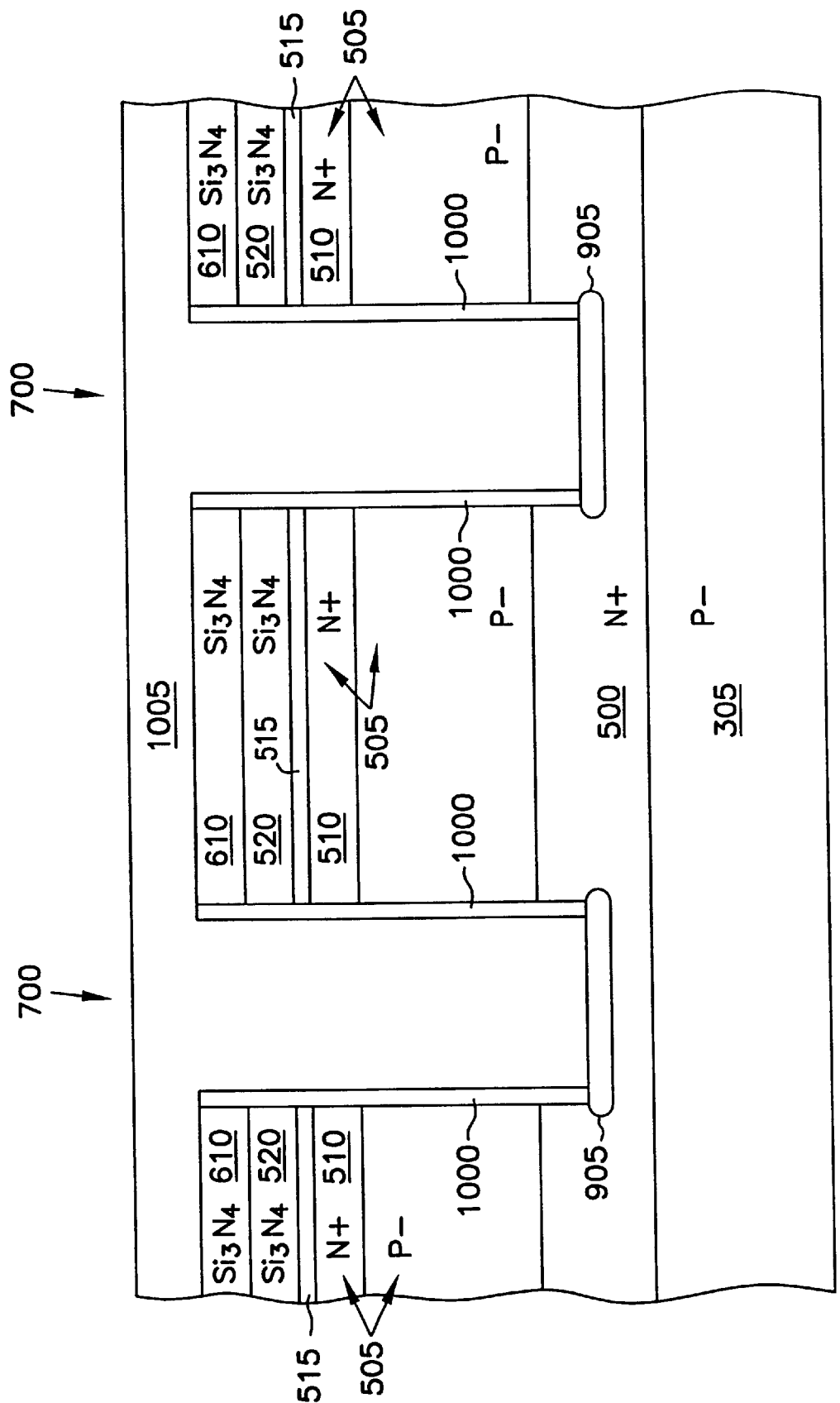
FIG. 12 is a cross-sectional view looking in the direction of the second troughs provided in FIG. 11 illustrating a barrier layer stripped from the sidewalls of the second troughs.

In FIG. 12, barrier layer 900 is stripped from the sidewalls of the second troughs 700, such as by a brief phosphoric acid etch, which is timed to expose the sidewalls of the second troughs 700 but which avoids significant removal of the thick silicon nitride masking layer 610. A gate dielectric layer 1000, such as silicon dioxide of thickness approximately between 5 nanometers and 10 nanometers (sometimes referred to as "tunnel oxide"), is formed substantially adjacent to the exposed sidewalls of the second troughs 700. A conductive layer 1005, such as N+ doped polysilicon, is formed in the second troughs 700, such as by CVD, to fill the second troughs 700. The conductive layer 1005 is planarized, such as by chemical mechanical polishing (CMP) or other suitable planarization technique.

Figure 13:
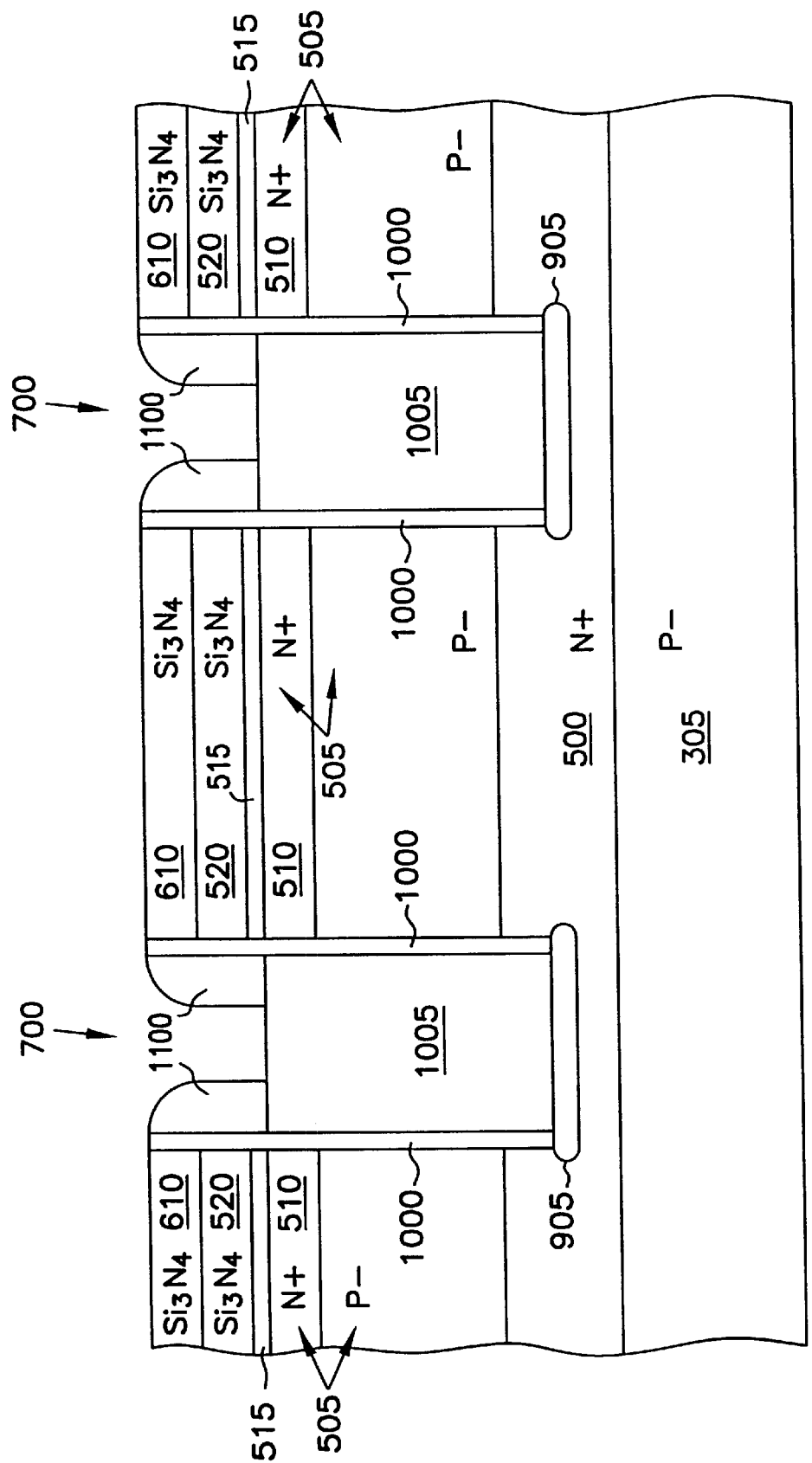
FIG. 13 is a cross-sectional view looking in the direction of the second troughs provided in FIG. 12 illustrating a conductive layer in the second troughs.

In FIG. 13, the conductive layer 1005 is etched back in the second troughs 700 to approximately at or slightly above the level of the silicon surface, which is defined by the interface between the second source/drain layer 510 and the pad oxide 515 layer. A spacer layer, such as silicon nitride of an approximate thickness of 100 nanometers, is deposited by CVD and anisotropically etched by reactive ion etching (RIE) to leave nitride spacers 1100 along the sidewalls of the second troughs 700, e.g. on the etched back portions of the conductive layer 1005, on the portions of insulator 605 in the intersections of first troughs 600 and second troughs 700, and against the second gate dielectric 1000.

Figure 14:
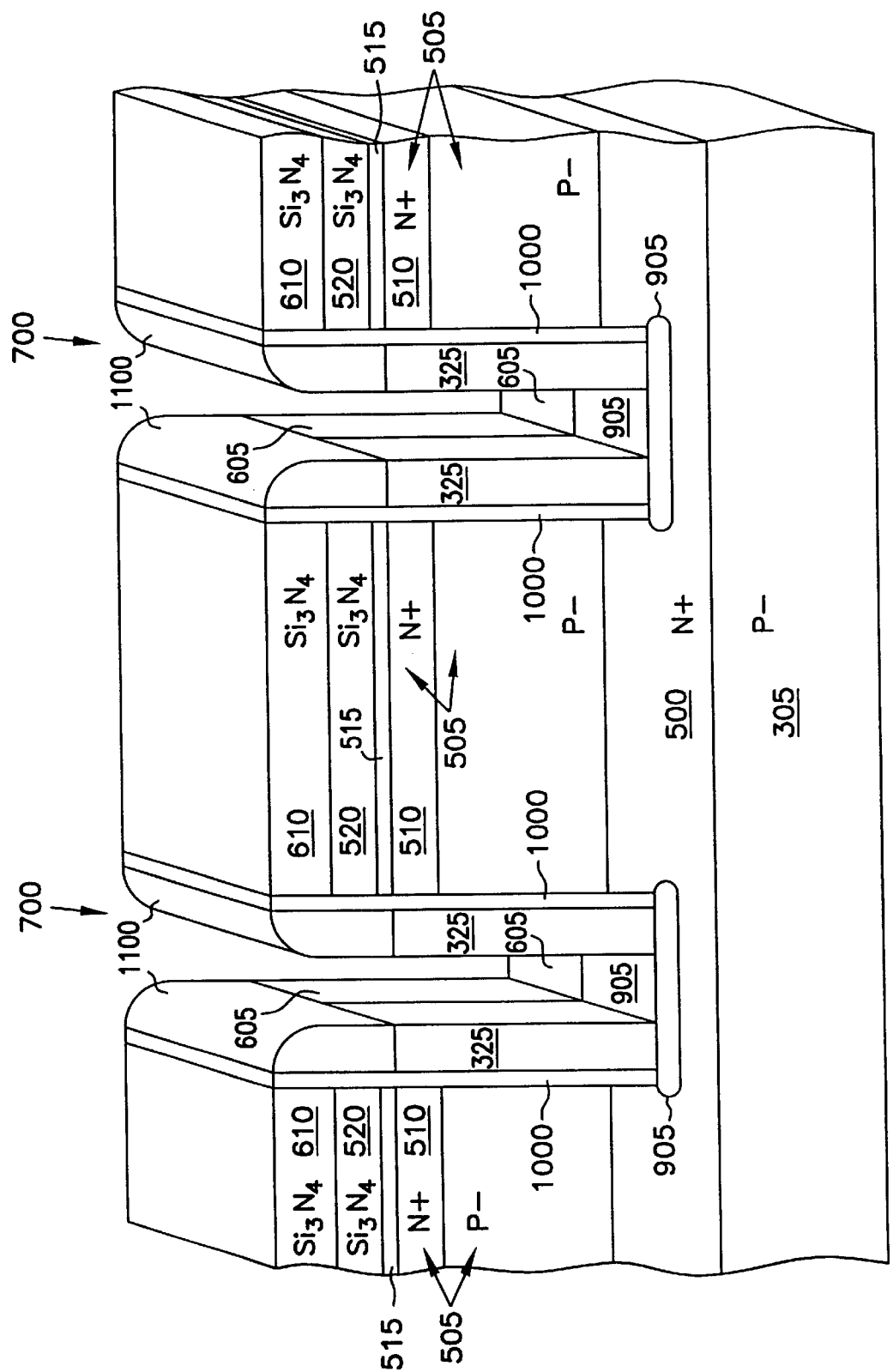
FIG. 14 is a perspective view of the second troughs provided in FIG. 13 illustrating spacers positioned to be used as a mask.

In the perspective view of FIG. 14, spacers 1100 are used as a mask for the anisotropic etching in the second troughs 700 of the etched back portions of polysilicon conductive layer 1005 and the portions of silicon dioxide insulator 605. A selective etch, which preferentially removes silicon dioxide but doesn't substantially remove polysilicon, is used to etch into portions of silicon dioxide insulator 605, but not the portions of polysilicon conductive layer 1005 in second troughs 700.

The portions of silicon dioxide insulator 605 in second troughs 700 are etched until they are approximately even with adjacent portions of bottom insulating layer 905. Then, a selective etch, which preferentially removes polysilicon but doesn't substantially remove silicon dioxide, is used to etch through portions of conductive layer 1005 in second troughs until the bottom insulation layer 905 is exposed, thereby forming from the polysilicon conductive layer 1005 separate floating gates 202 along the sidewalls of the second troughs 700.

Figure 15:
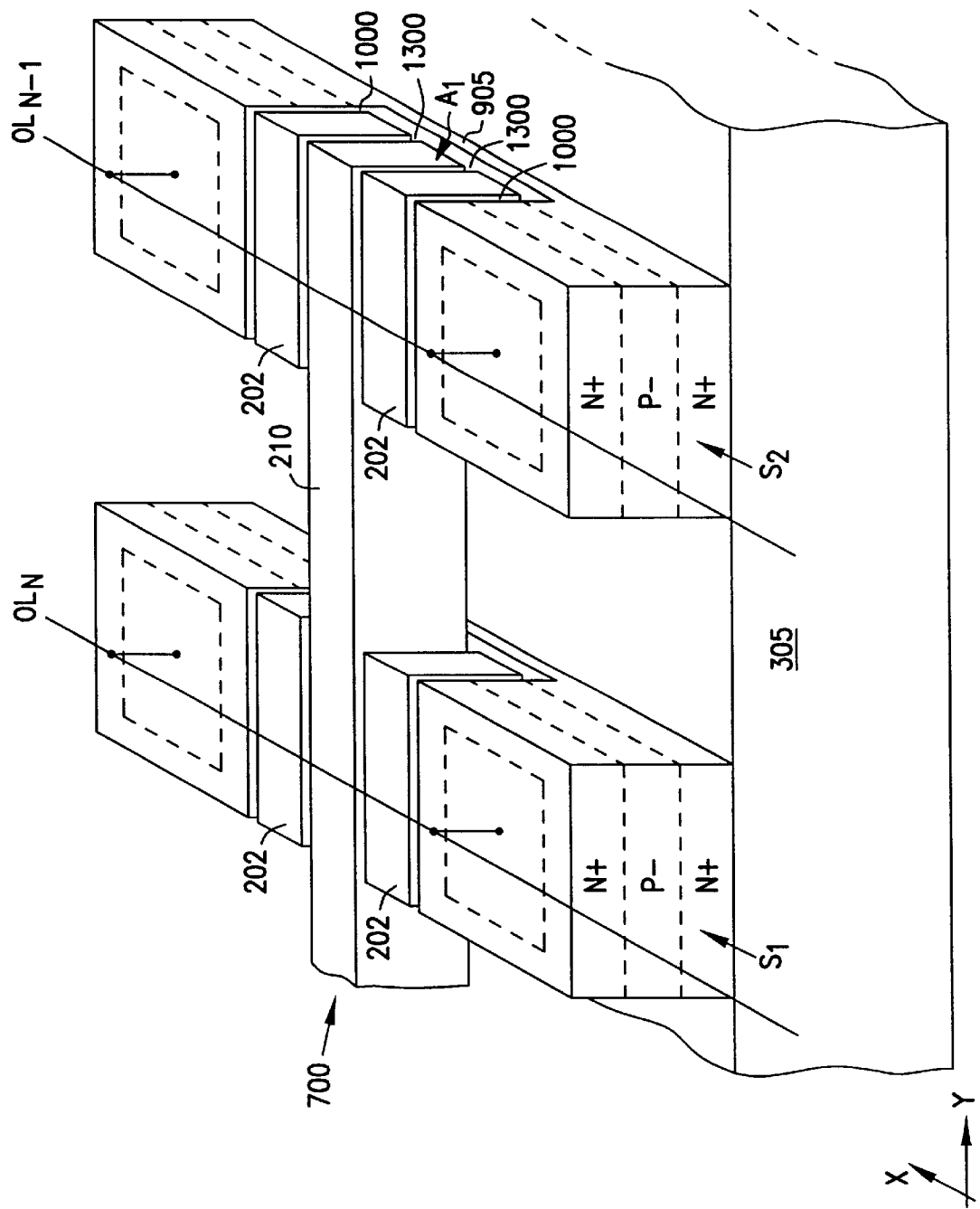
FIG. 15 is a perspective view illustrating a single control line formed between opposing floating gates in the second troughs provided in FIG. 14.

In the perspective view of FIG. 15, which is orthogonal to the perspective view of FIG. 14, an intergate dielectric 1300 is formed in the second troughs 700, such that the intergate dielectric 1300 has an approximate thickness between 7 nanometers and 15 nanometers. In one embodiment, formation of intergate dielectric 1300 is by thermal growth of silicon dioxide. In another embodiment, formation of intergate dielectric 1300 is by deposition of oxynitride by CVD.

Single control line 210, as illustrated in FIG. 15, are formed between opposing floating gates 202 in the second troughs 700 and separated therefrom by the intergate dielectric 1300. The control lines 210 in second troughs 700 are formed together with the output lines $OL_1$–$O_n$, in second troughs 700 by a single deposition greater than 150 nanometers of N+ doped polysilicon that fills second troughs 700 and is planarized, such as by CMP down to the top level of silicon nitride masking layer 610.

Figure 16:
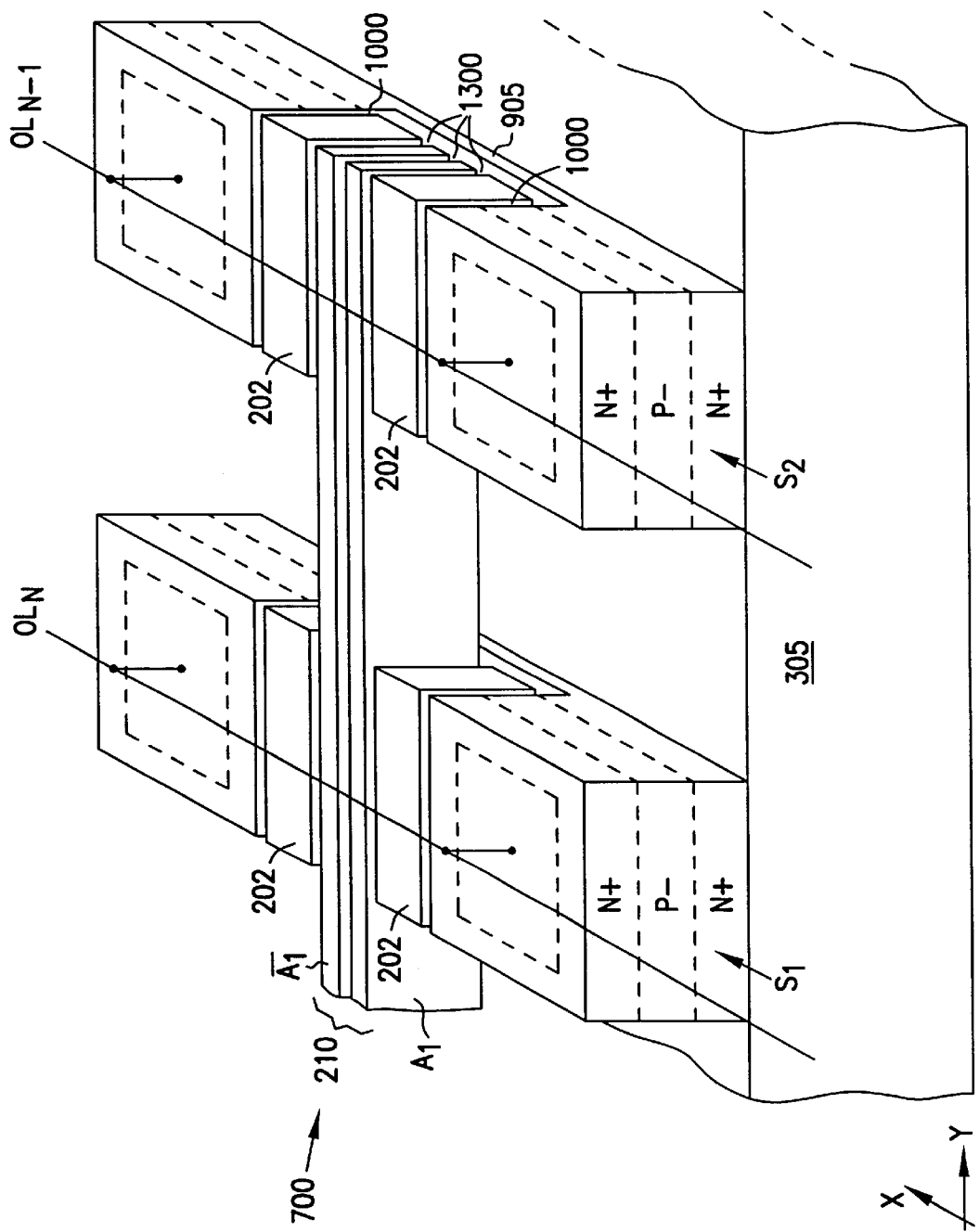
FIG. 16 is a perspective view illustrating split control lines formed between opposing floating gates in the second troughs provided in FIG. 14.

Split control lines 210, as illustrated in FIG. 16, are formed between opposing floating gates 202 in the second troughs 700 and separated therefrom by the intergate dielectric 1300. The control lines 210 in second troughs 700 are formed together with the output lines $OL_1$–$OL_n$ in second troughs 700 by a single deposition of approximately 70 nanometers of N+ doped polysilicon that is then directionally etched to leave on vertical services only as separated conducting lines.

Phosphoric acid is used to remove the remaining silicon nitride, such as spacers 1100, masking layer 610, and pad nitride 520, leaving the structure illustrated in FIG. 15. An insulator such as silicon dioxide is then deposited, and subsequent processing follows conventional techniques for forming contact holes, terminal metal, and inter level insulator steps to complete wiring of the cells 205 and other circuits of field programmable logic array 100.

Though FIGS. 8–16 illustrate generally one embodiment of forming the memory array 105 using bulk silicon processing techniques, in another embodiment a semiconductor-on-insulator (SOI) substrate is formed from substrate 305. In one such embodiment, a P– silicon starting material is used for substrate 305, and processing begins similarly to the bulk semiconductor embodiment described in FIG. 8. However, after the first troughs 600 are formed in FIG. 9, an oxidation barrier layer is formed on the sidewalls of the first troughs 600. An isotropic chemical etch is used to fully undercut the semiconductor regions separating the first troughs 600, and a subsequent oxidation step is used to fill in the evacuated regions formed by the undercutting. As a result, an insulator is formed on the bottoms of first troughs 600, bars of SOI are formed between first troughs 600, and the topography on the working surface of substrate 305 is separated from substrate 305 by an insulating layer. The barrier layer is then removed from the sidewalls of first troughs 600, which are then filled with insulator 605, as illustrated in FIG. 9. Thus, in the above described Figures, substrate 305 is understood to include bulk semiconductor as well as SOI embodiments in which the semiconductor integrated circuits formed on the surface of substrate 305 are isolated from each other and an underlying semiconductor portion of substrate 305 by an insulating layer.

One such method of forming bars of SOI is described in the Noble U.S. patent application Ser. No. 08/745,708 which is assigned to the assignee of the present application and which is herein incorporated by reference. Another such method of forming regions of SOI is described in the Forbes U.S. patent application Ser. No. 08/706,230, which is assigned to the assignee of the present application and which is herein incorporated by reference.

Thus, the present invention provides a high density field programmable logic array 100 that is easily programmed for selecting functional logic outputs based upon preselected inputs. Programmability is achieved with a field-effect transistor (FET) having an electrically isolated (floating) gate that controls electrical conduction between source regions and drain regions. Programmability is accomplished without having to mask the desired logic functions into an array structure. The floating gate transistor 200 only needs an area of only $2F^2$ to store a single bit of logic data.

It is to be understood that the above description is intended to be illustrative, and not restrictive. Many other embodiments will be apparent to those of skill in the art upon reviewing the above description. For example, though the logic cells 205 have been described with respect to a particular embodiment having two floating gate transistors 200 per pillar 300, a different number of floating gate transistors per pillar could also be used. It is also understood that the above structures and methods, which have been described with respect to field programmable logic array devices having floating gate transistors 200, are also applicable to other integrated circuits using vertically oriented field-effect transistors that do not have floating gates. Thus, the scope of the invention is not limited to the particular embodiments shown and described herein.

What is claimed is:

1. A method of forming a programmable logic array, the method comprising the steps of:

forming a plurality of first conductivity type semiconductor pillars upon a substrate, each pillar having top and side surfaces;

forming a plurality of first source and drain regions, of a second conductivity type, each of the first source and drain regions formed proximally to an interface between the pillar and the substrate;

forming a plurality of second source and drain regions, of a second conductivity type, each of the second source and drain regions formed within one of the pillars and distal to the substrate and separate from the first source and drain region;

forming a gate dielectric on at least a portion of the side surface of the pillars;

forming a plurality of floating gates, each of the floating gates formed substantially adjacent to a portion of the side surface of one of the pillars and separated therefrom by the gate dielectric;

forming a plurality of control lines, each of the control lines formed substantially adjacent to one of the floating gates and insulated therefrom, such that there are two control lines between the common pillars;

forming an intergate dielectric, interposed between ones of the floating gates and ones of the control lines;

forming an intergate dielectric, interposed between the two control lines between the common pillars;

forming a plurality of input lines that interconnect with some of the control lines;

forming at least one first source and drain interconnection line interconnecting ones of the first source and drain regions;

forming a plurality of interconnecting array lines that interconnect from the second source and drain regions corresponding to the control lines having connection with the input lines to the control lines not connected to the input lines; and forming a plurality of output lines, each output line interconnecting with the second source and drain regions not connected to the interconnecting array lines.

2. The method of claim 1, further comprising the step of forming an insulating layer between the semiconductor pillars and a semiconductor portion of the substrate.

3. A method of forming a programmable logic array, the method comprising the steps of:

forming a plurality of first conductivity type semiconductor pillars upon a substrate, each pillar having top and side surfaces;

forming a plurality of first source and drain regions, of a second conductivity type, each of the first source and drain regions formed proximally to an interface between the pillar and the substrate;

forming a plurality of second source and drain regions, of a second conductivity type, each of the second source and drain regions formed within one of the pillars and distal to the substrate and separate from the first source and drain region;

forming a gate dielectric on at least a portion of the side surface of the pillars;

forming a plurality of floating gates, each of the floating gates formed substantially adjacent to a portion of the side surface of one of the pillars and separated therefrom by the gate dielectric;

forming a plurality of control lines, each of the control lines formed substantially adjacent to one of the floating gates and insulated therefrom, such that there are two control lines between the common pillars;

forming an intergate dielectric, interposed between ones of the floating gates and ones of the control lines;

forming an intergate dielectric, interposed between the two control lines between the common pillars;

forming a plurality of input lines that interconnect with some of the control lines;

forming at least one first source and drain interconnection line interconnecting ones of the first source and drain regions;

forming a plurality of interconnecting array lines that interconnect from the second source and drain regions corresponding to the control lines having connection with the input lines to the control lines not connected to the input lines; and forming a plurality of output lines, each output line interconnecting with the second source and drain regions not connected to the interconnecting array lines;

wherein the step of forming the at least one first source and drain interconnection line is carried out at least partially within the substrate.

4. The method of claim 3, wherein the step of forming the plurality of input lines includes forming a plurality of substantially parallel input lines.

5. A method of forming a programmable logic array, the method comprising the steps of:

forming a plurality of first conductivity type semiconductor pillars upon a substrate, each pillar having top and side surfaces;

forming a plurality of first source and drain regions, of a second conductivity type, each of the first source and drain regions formed proximally to an interface between the pillar and the substrate;

forming a plurality of second source and drain regions, of a second conductivity type, each of the second source and drain regions formed within one of the pillars and distal to the substrate and separate from the first source and drain region;

forming a gate dielectric on at least a portion of the side surface of the pillars;

forming a plurality of floating gates, each of the floating gates formed substantially adjacent to a portion of the side surface of one of the pillars and separated therefrom by the gate dielectric;

forming a plurality of control lines, each of the control lines formed substantially adjacent to one of the floating gates and insulated therefrom, such that there are two control lines between the common pillars;

forming an intergate dielectric, interposed between ones of the floating gates and ones of the control lines;

forming an intergate dielectric, interposed between the two control lines between the common pillars;

forming a plurality of input lines that interconnect with some of the control lines;

forming at least one first source and drain interconnection line interconnecting ones of the first source and drain regions;

forming a plurality of interconnecting array lines that interconnect from the second source and drain regions corresponding to the control lines having connection with the input lines to the control lines not connected to the input lines; and forming a plurality of output lines, each output line interconnecting with the second source and drain regions not connected to the interconnecting array lines;

wherein the step of forming the plurality of pillars further comprises the steps of:

growing an epitaxial layer on the substrate;

etching the epitaxial layer and a portion of the underlying substrate to form a plurality of first troughs therein for carrying an insulator; and etching the epitaxial layer to form therein a plurality of second troughs, substantially orthogonal to the plurality of first troughs, the second troughs for carrying the input lines.

6. The method of claim 5, wherein the step of forming the plurality of floating gates comprises the steps of:

depositing polysilicon in the second troughs; and etching the deposited polysilicon in a median portion of the second troughs to form ones of the floating gates on either side of the second troughs, each floating gate adjacent to one of the pillars but separated therefrom by the gate dielectric.

7. The method of claim 6, wherein the steps of forming the plurality of input lines comprises the steps of:

etching into the substrate in a median portion of the second troughs; and depositing conductive polysilicon in and above the substrate in the etched median portion of the second troughs to form the input lines.

8. The method of claim 1, wherein the step of forming the plurality of second source and drain regions comprises the step of ion-implanting a dopant of the second conductivity type.

9. The method of claim 1, wherein the step of forming the gate dielectric comprises the step of growing on the side surface of each pillar a layer of silicon dioxide of thickness approximately between 5 nanometers and 10 nanometers.

10. The method of claim 1, wherein the step of forming the plurality of interconnecting array lines comprises the steps of:

depositing an insulator over the pillars, the floating gates and the control lines, and first and second input lines;

forming contact holes in the insulator to contact the second and source drain regions of each pillar;

depositing a conductive layer on the insulator and in the contact holes; and etching the conductive layer to form the resulting interconnecting array lines.

11. The method of claim 1, wherein the step of forming the plurality of output lines comprises the steps of:

depositing an insulator over the pillars, the floating gates and the control lines, and first and second input lines;

forming contact holes in the insulator to contact the second source and drain regions of each pillar;

depositing a conductive layer on the insulator and in the contact holes; and etching the conductive layer to form the resulting output lines.

12. A method of forming a programmable logic array on a substrate, the method comprising the steps of:

forming an AND plane and an OR plane, comprising:

forming a first source and drain layer at a surface of the substrate;

forming a semiconductor epitaxial layer on the first source and drain layer;

forming a second source and drain layer at a surface of the epitaxial layer;

etching, in a first direction, a plurality of substantially parallel first troughs in the epitaxial layer;

forming an insulator in the first troughs;

etching, in a second direction that is substantially orthogonal to the first direction, a plurality of substantially parallel second troughs in the epitaxial layer;

forming a gate dielectric layer substantially adjacent to sidewall regions of the second troughs;

forming a conductive layer in the second troughs;

removing a portion of the conductive layer in the second troughs such that floating gate regions are formed along the sidewall regions therein and separated from the sidewall regions by the gate dielectric layer;

forming an intergate dielectric layer on exposed portions of the floating gate regions in the second troughs; and forming control line regions between opposing floating gate regions in the second troughs and separated from the floating gate regions in the second troughs by the intergate dielectric layer.

13. The method of claim 12, wherein the substrate is a bulk semiconductor.

14. The method of claim 12, wherein the substrate includes a semiconductor-on-insulator portion.

15. The method of claim 12, further comprising forming an insulating layer undercutting semiconductor regions between the first troughs.

16. A method of forming a programmable logic array on a substrate, the method comprising the steps of:
forming an AND plane and an OR plane, comprising:
forming a first source and drain layer at a surface of the substrate;
forming a semiconductor epitaxial layer on the first source and drain layer;
forming a second source and drain layer at a surface of the epitaxial layer;
etching, in a first direction, a plurality of substantially parallel first troughs in the epitaxial layer;
forming an insulator in the first troughs;
etching, in a second direction that is substantially orthogonal to the first direction, a plurality of substantially parallel second troughs in the epitaxial layer;
forming a gate dielectric layer substantially adjacent to sidewall regions of the second troughs;
forming a conductive layer in the second troughs;
removing a portion of the conductive layer in the second troughs such that floating gate regions are formed along the sidewall regions therein and separated from the sidewall regions by the gate dielectric layer;
forming an intergate dielectric layer on exposed portions of the floating gate regions in the second troughs;
forming split control line regions between opposing floating gate regions in the second troughs;
separating from the floating gate regions in the second troughs by the intergate dielectric layer;
separating the split control lines by the intergate dielectric layer.

17. The method of claim 16, wherein the substrate is a bulk semiconductor.

18. The method of claim 16, wherein the substrate includes a semiconductor-on-insulator portion.

19. The method of claim 16, further comprising forming an insulating layer undercutting semiconductor regions between the first troughs.

20. A method of forming a programmable logic array on a substrate, the method comprising the steps of:
forming an AND plane and an OR plane, comprising:
forming a first source and drain layer at a surface of the substrate;
forming a semiconductor epitaxial layer on the first source and drain layer;
forming a second source and drain layer at a surface of the epitaxial layer;
etching, in a first direction, a plurality of substantially parallel first troughs in the epitaxial layer;
forming an insulator in the first troughs;
etching, in a second direction that is substantially orthogonal to the first direction, a plurality of substantially parallel second troughs in the epitaxial layer;
forming a gate dielectric layer substantially adjacent to sidewall regions of the second troughs;
forming a conductive layer in the second troughs;
removing a portion of the conductive layer in the second troughs such that floating gate regions are formed along the sidewall regions therein and separated from the sidewall regions by the gate dielectric layer;
forming an intergate dielectric layer on exposed portions of the floating gate regions in the second troughs;
forming control line regions between opposing floating gate regions in the second troughs and separated from the floating gate regions in the second troughs by the intergate dielectric layer; and
forming an inverter in communication with the AND plane and the OR plane; and
forming a driver in communication with the AND plane and the OR plane.

21. The method of claim 20, wherein the substrate is a bulk semiconductor.

22. The method of claim 20, wherein the substrate includes a semiconductor-on-insulator portion.

23. The method of claim 20, further comprising forming an insulating layer undercutting semiconductor regions between the first troughs.

24. A method of forming a programmable logic array on a substrate, the method comprising the steps of:
forming an AND plane and an OR plane, comprising:
forming a first source and drain layer at a surface of the substrate;
forming a semiconductor epitaxial layer on the first source and drain layer;
forming a second source and drain layer at a surface of the epitaxial layer;
etching, in a first direction, a plurality of substantially parallel first troughs in the epitaxial layer;
forming an insulator in the first troughs;
etching, in a second direction that is substantially orthogonal to the first direction, a plurality of substantially parallel second troughs in the epitaxial layer;
forming a gate dielectric layer substantially adjacent to sidewall regions of the second troughs;
forming a conductive layer in the second troughs;
removing a portion of the conductive layer in the second troughs such that floating gate regions are formed along the sidewall regions therein and separated from the sidewall regions by the gate dielectric layer;
forming an intergate dielectric layer on exposed portions of the floating gate regions in the second troughs;
forming split control line regions between opposing floating gate regions in the second troughs;
separating from the floating gate regions in the second troughs by the intergate dielectric layer;
separating the split control lines by the intergate dielectric layer;
forming an inverter in communication with the AND plane and the OR plane; and
forming a driver in communication with the AND plane and the OR plane.

25. The method of claim 24, wherein the substrate is a bulk semiconductor.

26. The method of claim 24, wherein the substrate includes a semiconductor-on-insulator portion.

27. The method of claim 24, further comprising forming an insulating layer undercutting semiconductor regions between the first troughs.

* * * * *

UNITED STATES PATENT AND TRADEMARK OFFICE
CERTIFICATE OF CORRECTION

PATENT NO. : 6,486,027 B1
DATED : November 26, 2002
INVENTOR(S) : Leonard Forbes and Wendell P. Noble Jr.

It is certified that error appears in the above-identified patent and that said Letters Patent is hereby corrected as shown below:

Title page,
Item [56], FOREIGN PATENT DOCUMENTS, 4th reference, insert -- H01L/27/108 -- after "5/1999".
FOREIGN PATENT DOCUMENTS, 5th reference, insert -- H01L/29/786 -- after "6/2000".
Item [56], U.S. PATENT DOCUMENTS, delete "5,640,642" and insert -- 5,640,342 -- therefor.
"5,641,545 A", delete "Sanhu" and insert -- Sandhu -- therefor.
"5,874,760 A", insert -- Jr. -- after "Burns".
"6,040,210 A", insert -- Jr. -- after "Burns".

Column 14,
Line 31, delete "$OL_1$-$O_n$," and insert -- $OL_1$-$OL_n$ -- therefor.

Column 17,
Line 1, in claim 4, delete "claim 3" and insert -- claim 1 -- therefor.

Signed and Sealed this

Twelfth Day of August, 2003

JAMES E. ROGAN
*Director of the United States Patent and Trademark Office*